(12) United States Patent
Li et al.

(10) Patent No.: US 11,832,501 B2
(45) Date of Patent: Nov. 28, 2023

(54) DISPLAY PANEL

(71) Applicant: BOE TECHNOLOGY GROUP CO., LTD., Beijing (CN)

(72) Inventors: Chunyan Li, Beijing (CN); Chen Xu, Beijing (CN); Jingquan Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 197 days.

(21) Appl. No.: 17/436,078

(22) PCT Filed: Jun. 8, 2021

(86) PCT No.: PCT/CN2021/098919
§ 371 (c)(1),
(2) Date: Sep. 3, 2021

(87) PCT Pub. No.: WO2022/037195
PCT Pub. Date: Feb. 24, 2022

(65) Prior Publication Data
US 2023/0180584 A1    Jun. 8, 2023

(30) Foreign Application Priority Data
Aug. 17, 2020 (CN) .......................... 202010822603.5

(51) Int. Cl.
*H10K 59/80* (2023.01)
*G06F 3/044* (2006.01)
(Continued)

(52) U.S. Cl.
CPC ......... *H10K 59/873* (2023.02); *G06F 3/0412* (2013.01); *G06F 3/0443* (2019.05);
(Continued)

(58) Field of Classification Search
CPC ............ H10K 59/00–95; H10K 50/844; G06F 3/041–047; G06F 2203/041–04114; G06F 3/0412
See application file for complete search history.

(56) References Cited

U.S. PATENT DOCUMENTS 10,431,637 B2    10/2019    Jin et al.
10,461,268 B2    10/2019    Jiang et al.
(Continued)

FOREIGN PATENT DOCUMENTS

CN    106252526 A    12/2016
CN    107123667 A    9/2017
(Continued)

OTHER PUBLICATIONS

Office Action issued for Australian PAtent Application No. 2021215098, dated Jul. 27, 2022, 3 pages.
(Continued)

*Primary Examiner* — Sanjiv D. Patel
(74) *Attorney, Agent, or Firm* — Dave Law Group LLC; Raj S. Dave

(57) ABSTRACT

A display panel is provided. The display panel has a display region and a peripheral region, the peripheral region includes a first peripheral region, a bending region, and a second peripheral region. The display panel includes a base substrate, a driving circuit layer, an organic structure, and an encapsulation layer; the organic structure includes a first organic structure and a second organic structure, the first organic structure is in the first peripheral region, and the second organic structure includes a first portion in the first peripheral region and a second portion in the bending region; the encapsulation layer partially overlaps with the second organic structure, a portion of the encapsulation layer which overlaps with the second organic structure includes a first encapsulation portion and a second encapsulation por-
(Continued)

tion; an average thickness of the first encapsulation portion is greater than an average thickness of the second encapsulation portion.

19 Claims, 12 Drawing Sheets

(51) Int. Cl.
*G06F 3/041* (2006.01)
*H10K 59/131* (2023.01)
*H10K 59/40* (2023.01)

(52) U.S. Cl.
CPC ........ *G06F 3/0446* (2019.05); *G06F 3/04164* (2019.05); *H10K 59/131* (2023.02); *H10K 59/40* (2023.02); *G06F 2203/04102* (2013.01); *G06F 2203/04107* (2013.01); *G06F 2203/04111* (2013.01)

(56) References Cited

U.S. PATENT DOCUMENTS

| | | | |
|---|---|---|---|
| 10,503,327 B2 | 12/2019 | Cai et al. | |
| 10,680,204 B2 | 6/2020 | Qiao et al. | |
| 10,868,102 B1 | 12/2020 | Zhang et al. | |
| 11,011,715 B2 | 5/2021 | Guo et al. | |
| 2015/0102298 A1 | 4/2015 | Namkung et al. | |
| 2018/0053810 A1 | 2/2018 | Jin et al. | |
| 2018/0315951 A1 | 11/2018 | Seong et al. | |
| 2019/0019966 A1* | 1/2019 | Jiang | H10K 77/111 |
| 2019/0207160 A1* | 7/2019 | Wang | H10K 50/8445 |
| 2020/0209916 A1 | 7/2020 | Zhang et al. | |
| 2021/0234122 A1* | 7/2021 | Choi | F03D 7/0272 |
| 2021/0336213 A1 | 10/2021 | Yan et al. | |

FOREIGN PATENT DOCUMENTS

| | | | | |
|---|---|---|---|---|
| CN | 107180852 A | | 9/2017 | |
| CN | 107706220 A | | 2/2018 | |
| CN | 108417608 A | | 8/2018 | |
| CN | 108711577 A | | 10/2018 | |
| CN | 208478340 U | | 2/2019 | |
| CN | 109935615 A | | 6/2019 | |
| CN | 110007802 A | | 7/2019 | |
| CN | 110197845 A | | 9/2019 | |
| CN | 110416435 A | | 11/2019 | |
| CN | 111710712 A | | 9/2020 | |
| EP | 3217265 A1 | | 9/2017 | |
| KR | 1020160140080 A | | 12/2016 | |
| KR | 20210025145 A | * | 3/2021 | ......... H10K 59/5885 |
| WO | 2019167358 A1 | | 9/2019 | |

OTHER PUBLICATIONS

European search report issued for EP Application No. 21749523.3, dated Oct. 28, 2022, 7 pages.

* cited by examiner

DISPLAY PANEL

CROSS-REFERENCE TO RELATED APPLICATIONS

The present application is the U.S. National Stage Entry of PCT/CN2021/098919, filed on Jun. 8, 2021, which claims priority to Chinese Patent Application No. 202010822603 5, filed on Aug. 17, 2020, the entire disclosures of which are incorporated herein by reference as part of the disclosure of this application.

TECHNICAL FIELD

Embodiments of the present disclosure relate to a display panel.

BACKGROUND

An AMOLED (active matrix organic light-emitting diode) is a self-luminous display, which has the advantages of a faster response, a higher contrast, a wider viewing angle, or the like, and thus the AMOLED has been more and more widely used.

With rapid development of AMOLED technology, displays have gradually entered the type of full screens and folding screens. In order to provide users with a better experience, display products such as flexible wear and folding display products will become important development directions in the display field in the future.

SUMMARY

At least one embodiment of the present disclosure provides a display panel, the display panel has a display region and a peripheral region surrounding the display region, the peripheral region comprises a first peripheral region, a bending region, and a second peripheral region, the first peripheral region is on a side of the second peripheral region close to the display region, and the bending region is between the first peripheral region and the second peripheral region; and the display panel comprises a base substrate; a driving circuit layer, an organic structure, and an encapsulation layer, the driving circuit layer is on the base substrate; the organic structure is on a side of the driving circuit layer away from the base substrate, the organic structure comprises a first organic structure and a second organic structure spaced apart in the peripheral region, the first organic structure is on a side of the second organic structure close to the display region, the first organic structure is in the first peripheral region, and the second organic structure comprises a first portion in the first peripheral region and a second portion in the bending region which are continuous; and the encapsulation layer on a side of the organic structure away from the base substrate, the encapsulation layer covers the display region and at least part of the first peripheral region, the encapsulation layer partially overlaps with the second organic structure in a direction perpendicular to the base substrate, a portion of the encapsulation layer which overlaps with the second organic structure comprises a first encapsulation portion and a second encapsulation portion, and the first encapsulation portion is on a side of the second encapsulation portion close to the display region, in the direction perpendicular to the base substrate, an average thickness of the first encapsulation portion is greater than an average thickness of the second encapsulation portion.

For example, in the display panel provided by at least one embodiment of the present disclosure, a direction from the display region to the bending region is a first direction, the second encapsulation portion comprises a plurality of encapsulation regions sequentially arranged in the first direction, and average thicknesses of the plurality of encapsulation regions gradually decrease in the first direction.

For example, the display panel provided by at least one embodiment of the present disclosure further comprises a touch layer, the touch layer comprises a touch electrode and a touch wire electrically connected to the touch electrode, the touch wire extends from the display region to the second peripheral region, and at least part of the touch wire is on a side of the encapsulation layer away from the base substrate and overlaps with the second organic structure in the direction perpendicular to the base substrate; and the touch wire comprises a first touch wire portion and a second touch wire portion, the first touch wire portion is on a side of the first encapsulation portion away from the base substrate, the second touch wire portion is on a side of the second encapsulation portion away from the base substrate, and an average distance from a surface of the first touch wire portion away from the base substrate to the base substrate is greater than an average distance from a surface of the second touch wire portion away from the base substrate to the base substrate.

For example, in the display panel provided by at least one embodiment of the present disclosure, the first peripheral region comprises a first sub-peripheral region on a side close to the bending region and a second sub-peripheral region outside the first sub-peripheral region, and an average thickness of the encapsulation layer in the first sub-peripheral region is smaller than an average thickness of the encapsulation layer in the second sub-peripheral region.

For example, in the display panel provided by at least one embodiment of the present disclosure, the first sub-peripheral region comprises a main region and two corner regions, the two corner regions are respectively on both sides of the main region and between the first sub-peripheral region and the second sub-peripheral region, and an average thickness of the encapsulation layer in each of the two corner regions is smaller than the average thickness of the encapsulation layer in the second sub-peripheral region, and is greater than an average thickness of the encapsulation layer in the main region.

For example, in the display panel provided by at least one embodiment of the present disclosure, the encapsulation layer comprises a first inorganic layer, a first organic layer, a second inorganic layer, and a third inorganic layer which are sequentially stacked; and the first organic layer is covered by the first inorganic layer and the second inorganic layer, an edge of the first organic layer is on a side of the first organic structure close to the display region, and each of the first encapsulation portion and the second encapsulation portion comprises the first inorganic layer, the second inorganic layer, and the third inorganic layer which are stacked.

For example, in the display panel provided by at least one embodiment of the present disclosure, each of the first encapsulation portion and the second encapsulation portion has a flat surface; and in the direction perpendicular to the base substrate, a thickness of the first encapsulation portion is a first thickness, a thickness of the second encapsulation portion is a second thickness, the first thickness is greater than the second thickness, and the first encapsulation portion and the second encapsulation portion are step-shaped as a whole.

For example, in the display panel provided by at least one embodiment of the present disclosure, the first encapsulation portion has a flat surface, a surface of the second encapsulation portion comprises at least one first groove, and the at least one first groove extends in a direction parallel to a bending axis of the bending region; and in the direction perpendicular to the base substrate, a thickness of the first encapsulation portion is a first thickness, an average thickness of the second encapsulation portion is a second thickness, and the first thickness is greater than the second thickness.

For example, in the display panel provided by at least one embodiment of the present disclosure, a direction from the display region to the bending region is a first direction, the second encapsulation portion comprises a plurality of encapsulation regions sequentially arranged in the first direction, the at least one first groove comprises a plurality of first grooves respectively provided in the plurality of encapsulation regions, and the plurality of first grooves are arranged to allow average thicknesses of the plurality of encapsulation regions to gradually decrease in the first direction.

For example, in the display panel provided by at least one embodiment of the present disclosure, at least part of a surface of the second encapsulation portion away from the base substrate is a curved surface.

For example, in the display panel provided by at least one embodiment of the present disclosure, the curved surface is a concave curved surface.

For example, in the display panel provided by at least one embodiment of the present disclosure, a surface of at least part of the second encapsulation portion away from the base substrate has a varying slope in a direction away from the display region.

For example, in the display panel provided by at least one embodiment of the present disclosure, in the surface of the at least part of the second encapsulation portion away from the base substrate, a slope of a portion close to the display region is greater than a slope of a portion away from the display region.

For example, in the display panel provided by at least one embodiment of the present disclosure, a slope difference between a maximum value and a minimum value of the slope of the surface of the at least part of the second encapsulation portion away from the base substrate is greater than 0 and smaller than 0.2.

For example, in the display panel provided by at least one embodiment of the present disclosure, an average slope of a sidewall of the second organic structure close to the first organic structure is greater than twice an average slope of a surface of the second encapsulation portion away from the base substrate.

For example, in the display panel provided by at least one embodiment of the present disclosure, the second touch wire portion of the touch wire directly contacts the at least one first groove.

For example, in the display panel provided by at least one embodiment of the present disclosure, the first organic structure comprises a first dam and a second dam which are arranged at an interval, and the first dam is on a side of the second dam close to the display region, a direction from the display region to the bending region is a first direction; and in the first direction, the first dam has a first width W1, the second dam has a second width W2, a minimum distance between the second organic structure and the second dam is L2, and L2>0.5*(W1+W2).

For example, in the display panel provided by at least one embodiment of the present disclosure, the first dam and the second dam respectively comprise a first sidewall and a second sidewall which are opposite, the second organic structure comprises a third sidewall on a side close to the first organic structure, and the first encapsulation portion covers at least the third sidewall; and the first sidewall, the second sidewall, and the third sidewall form a plurality of slope angles with a plane where the base substrate is located, each of the plurality of slope angles is an acute angle, and an absolute value of a difference between any two slope angles of the plurality of slope angles is smaller than 20°.

For example, in the display panel provided by at least one embodiment of the present disclosure, the third sidewall is step-shaped as a whole and comprises a first step and a second step, the second step is on a side of the first step away from the base substrate, and a slope angle formed by the first step with the plane where the base substrate is located is smaller than a slope angle formed by the second step with the plane where the base substrate is located.

For example, in the display panel provided by at least one embodiment of the present disclosure, the second encapsulation portion ends at a side of the bending region close to the display region, and in the direction perpendicular to the base substrate, the average thickness of the first encapsulation portion is greater than twice the average thickness of the second encapsulation portion.

For example, in the display panel provided by at least one embodiment of the present disclosure, a minimum distance between an orthographic projection of the second encapsulation portion on the base substrate and an orthographic projection of the second dam on the base substrate is a first distance, a minimum distance between an orthographic projection of the first encapsulation portion on the base substrate and the orthographic projection of the second dam on the base substrate is a second distance, and the first distance is greater than 1.5 times the second distance.

For example, in the display panel provided by at least one embodiment of the present disclosure, the first organic structure comprises a first dam and a second dam which are arranged at an interval, and the first dam is on a side of the second dam close to the display region; and a surface of at least one of the first dam and the second dam comprises at least one second groove, and the at least one second groove extends in a direction parallel to a bending axis of the bending region.

For example, in the display panel provided by at least one embodiment of the present disclosure, the at least one second groove comprises n−1 second grooves, the at least one of the first dam and the second dam is divided into n portions by the n−1 second grooves, and n is a positive integer greater than or equal to 2; and a direction from the display region to the bending region is a first direction, in the first direction, widths of the n portions are w1, w2, . . . , wn, respectively, widths of the n−1 second grooves are d1, d2, . . . , dn−1, respectively, d represents at least one of d1, d2, . . . , dn−1, and $$d<2\times(w1+w2+\ldots wn)/n; w1, w2, \ldots, wn>0.$$

For example, in the display panel provided by at least one embodiment of the present disclosure, the n portions comprise an i-th portion and a j-th portion, a width of the i-th portion is wi, a width of the j-th portion is wj, an i-th groove is provided between the i-th portion and the j-th portion, a width of the i-th groove is di, and $$di>|wi-wj|, 1\leq i\leq n-1, 1\leq j\leq n, j=i+1.$$

For example, in the display panel provided by at least one embodiment of the present disclosure, the w1, w2, . . . , wn increase in sequence, and an increase value in sequence is $w1 \times (25\% \sim 50\%)$.

For example, in the display panel provided by at least one embodiment of the present disclosure, a thickness of at least one of the first dam and the second dam is H, a depth of the second groove is h, and $h = k \times H, 0.5 \leq k \leq 1$.

For example, in the display panel provided by at least one embodiment of the present disclosure, a surface of the second dam comprises the at least one second groove, the second dam comprises a first sidewall and a second sidewall which are opposite, the first sidewall is closer to the display region than the second sidewall, and a slope angle formed by the first sidewall with a plane where the base substrate is located is b1; and the second groove comprises a third sidewall and a fourth sidewall which are opposite, the third sidewall is closer to the display region than the fourth sidewall, a slope angle formed by the third sidewall with the plane where the base substrate is located is c1, a slope angle formed by the fourth sidewall with the plane where the base substrate is located is c2, c represents at least one of c1 and c2, and $h/\tan c + H/\tan b1 < w1$, $\arctan [k \times H/(w1 - H/\tan b1)] < c < 90°$.

For example, in the display panel provided by at least one embodiment of the present disclosure, a planar shape of the at least one second groove is rectangular, trapezoidal or hexagonal.

For example, in the display panel provided by at least one embodiment of the present disclosure, the at least one second groove comprises a plurality of second grooves, and the plurality of second grooves extend in a direction parallel to a bending axis of the bending region; and a direction from the display region to the bending region is a first direction, in the first direction, the plurality of second grooves are arranged in sequence, and extension lengths of the plurality of second grooves gradually decrease.

For example, the display panel provided by at least one embodiment of the present disclosure further comprises a plurality of sub-pixels arranged in an array, each of the plurality of sub-pixels comprises a pixel driving circuit and a light-emitting device, the pixel driving circuit comprises a thin film transistor, the thin film transistor comprises a gate electrode and source-drain electrodes, the light-emitting device comprises a first electrode, a second electrode, and a light-emitting layer between the first electrode and the second electrode, and the first electrode is electrically connected to one of the source-drain electrodes; and the display panel further comprises a first power wire in the peripheral region, the first power wire comprises a first portion and a second portion connected in parallel, the first portion and the source-drain electrodes are in an identical layer, and the second portion and the first electrode are in an identical layer.

For example, the display panel provided by at least one embodiment of the present disclosure further comprises a plurality of sub-pixels arranged in an array, each of the plurality of sub-pixels comprises a pixel driving circuit and a light-emitting device, the pixel driving circuit comprises a thin film transistor, the thin film transistor comprises a gate electrode and source-drain electrodes, the light-emitting device comprises a first electrode, a second electrode, and a light-emitting layer between the first electrode and the second electrode, and the first electrode is electrically connected to one of the source-drain electrodes; and the display panel further comprises a first power wire in the peripheral region, the first power wire comprises a first portion, a second portion, and a third portion connected in parallel, the first portion and the source-drain electrodes are in an identical layer, the second portion and the first electrode are in an identical layer, the first electrode is electrically connected to the one of the source-drain electrodes through a connection electrode, and the third portion and the connection electrode are in an identical layer.

For example, in the display panel provided by at least one embodiment of the present disclosure, in the direction perpendicular to the base substrate, the second portion of the first power wire partially overlaps with at least one of the first dam and the second dam, and a portion of the second portion of the first power wire which overlaps with the at least one of the first dam and the second dam comprises at least one opening.

For example, in the display panel provided by at least one embodiment of the present disclosure, an extending direction of the at least one opening is perpendicular to an extending direction of the at least one second groove.

For example, in the display panel provided by at least one embodiment of the present disclosure, in the direction perpendicular to the base substrate, the second portion of the first power wire further partially overlaps with the at least one second groove; and a depth of the at least one second groove is equal to a thickness of at least one of the first dam and the second dam, and a portion of the second portion of the first power wire which overlaps with the at least one second groove has no opening; or a depth of the at least one second groove is smaller than a thickness of at least one of the first dam and the second dam, the at least one opening comprises first part openings and second part openings, a portion of the second portion of the first power wire which overlaps with the at least one second groove comprises the first part openings, the second part openings are openings in the at least one opening except for the first part openings, and a size or arrangement density of the first part openings is smaller than a size or arrangement density of the second part openings.

For example, in the display panel provided by at least one embodiment of the present disclosure, at least one of the first dam and the second dam comprises an edge portion at an end of the at least one second groove; the edge portion has a gradually changing width, the edge portion comprises a first portion and a second portion, the first portion of the edge portion is on a side of the second portion of the edge portion away from the at least one second groove, and an average width of the first portion of the edge portion is smaller than an average width of the second portion of the edge portion; and an extension length of an opening overlapping with the first portion of the edge portion is greater than an extension length of an opening overlapping with the second portion of the edge portion, and a number of openings overlapping with the first portion of the edge portion is smaller than a number of openings overlapping with the second portion of the edge portion.

For example, the display panel provided by at least one embodiment of the present disclosure further comprises a fan-shaped wire region in the first peripheral region, the fan-shaped wire region comprises a plurality of wires, and in the direction perpendicular to the base substrate, the edge portion and the fan-shaped wire region do not overlap.

For example, the display panel provided by at least one embodiment of the present disclosure further comprises a touch layer on a side of the encapsulation layer away from the base substrate, the touch layer comprises a first touch metal layer, a touch insulating layer, and a second touch metal layer which are sequentially disposed on a side of the encapsulation layer away from the base substrate; and the second touch metal layer comprises a touch driving electrode extending in a first direction and a driving sensing electrode extending in a second direction, the first direction intersects the second direction, the driving sensing electrode comprises a plurality of separated portions, and the first touch metal layer comprises at least one bridge electrode for electrically connecting the plurality of separated portions.

For example, in the display panel provided by at least one embodiment of the present disclosure, the touch layer further comprises a touch wire electrically connected to the touch driving electrode or the driving sensing electrode, the touch wire comprises a first wire portion in the first touch metal layer and a second wire portion in the second touch metal layer, the touch insulating layer comprises at least one via, and the first wire portion and the second wire portion are electrically connected through the at least one via.

For example, in the display panel provided by at least one embodiment of the present disclosure, the first organic structure comprises a first dam and a second dam which are arranged at an interval, the first dam is on a side of the second dam close to the display region, and an extending direction of the at least one via is perpendicular to an extending direction of the first dam and the second dam; in the direction perpendicular to the base substrate, the at least one via comprises a first via overlapping with the first dam and a second via overlapping with the second dam; an orthographic projection of the first via on the base substrate is within an orthographic projection of the first dam on the base substrate, and does not overlap with an edge of the orthographic projection of the first dam on the base substrate; and an orthographic projection of the second via on the base substrate is within an orthographic projection of the second dam on the base substrate, and does not overlap with an edge of the orthographic projection of the second dam on the base substrate.

For example, in the display panel provided by at least one embodiment of the present disclosure, in the direction perpendicular to the base substrate, an overlapping area of the touch wire and the first dam is S, an overlapping area of the first via and the first dam is S1, and $0.2 < S1/S < 0.4$; and an overlapping area of the touch wire and the second dam is SS, an overlapping area of the second via and the second dam is SS1, and $0.2 < SS1/SS < 0.4$.

For example, in the display panel provided by at least one embodiment of the present disclosure, a slope angle formed by a sidewall of the first dam close to the display region and a plane where the base substrate is located is a1, a width of the first dam is W1, a height of the first dam is H1, an extension length of the first via is D1, and $0.5 < (W1-D1) \times 0.5 \times \tan(a1)/H1 < 0.95$; a slope angle formed by a sidewall of the second dam close to the display region and the plane where the base substrate is located is b1, a width of the second dam is W2, a height of the second dam is H2, an extension length of the second via is D2, and $0.5 < (W2-D2) \times 0.5 \times \tan(b1)/H2 < 0.95$.

For example, the display panel provided by at least one embodiment of the present disclosure further comprises a fan-shaped wire region in the first peripheral region, the fan-shaped wire region comprises a plurality of wires; and the display panel further comprises a shielding structure, in the direction perpendicular to the base substrate, the shielding structure is between the plurality of wires in the fan-shaped wire region and the touch wire, and a distance between the touch wire and the shielding structure is greater than a distance between the plurality of wires in the fan-shaped wire region and the shielding structure.

For example, in the display panel provided by at least one embodiment of the present disclosure, in the direction perpendicular to the base substrate, the shielding structure overlaps and directly contacts the first dam and the second dam.

For example, the display panel provided by at least one embodiment of the present disclosure further comprises a plurality of sub-pixels arranged in an array, each of the plurality of sub-pixels comprises a pixel driving circuit and a light-emitting device, the pixel driving circuit comprises a thin film transistor, the thin film transistor comprises a gate electrode and source-drain electrodes, the light-emitting device comprises a first electrode, a second electrode, and a light-emitting layer between the first electrode and the second electrode, and the first electrode is electrically connected to one of the source-drain electrodes; and the shielding structure comprises a first power wire, and the first power wire and the source-drain electrodes are in an identical layer, or the first power wire comprises a first portion and a second portion connected in parallel, the first portion and the source-drain electrodes are in an identical layer, and the second portion and the first electrode are in an identical layer, or the first power wire comprises a first portion, a second portion, and a third portion connected in parallel, the first portion and the source-drain electrodes are in an identical layer, the second portion and the first electrode are in an identical layer, the first electrode is electrically connected to the one of the source-drain electrodes through a connection electrode, and the third portion and the connection electrode are in an identical layer.

For example, in the display panel provided by at least one embodiment of the present disclosure, in the direction perpendicular to the base substrate, the second portion of the first power wire partially overlaps with at least one of the first dam and the second dam, and a portion of the second portion of the first power wire which overlaps with the at least one of the first dam and the second dam comprises a plurality of openings; and the at least one via comprises a plurality of vias, and orthographic projections of the plurality of vias on the base substrate and orthographic projections of the plurality of openings on the base substrate do not overlap and are alternately arranged.

For example, in the display panel provided by at least one embodiment of the present disclosure, the first organic structure comprises a first dam and a second dam which are arranged at an interval, the first dam is on a side of the second dam close to the display region, the first dam and the second dam respectively comprise a first sidewall and a second sidewall which are opposite, and the first sidewall is closer to the display region than the second sidewall; a slope angle formed by the first sidewall of the first dam and a plane where the base substrate is located is a1, a slope angle formed by the second sidewall of the first dam and the plane where the base substrate is located is a2, and a1 is greater than, less than, or equal to a2; a slope angle formed by the first sidewall of the second dam and the plane where the base substrate is located is b1, a slope angle formed by the second sidewall of the second dam and the plane where the base substrate is located is b2, and b1 is greater than b2; and $0 \leq |a1-a2|/(b1-b2) < 1$.

For example, in the display panel provided by at least one embodiment of the present disclosure, in the direction perpendicular to the base substrate, the second dam overlaps with the second portion of the first power wire, a portion of the second portion of the first power wire which overlaps with the second dam comprises a flat portion and a slope portion, and a slope angle formed by a surface of the flat portion away from the base substrate with the first sidewall of the second dam is b1.

At least one embodiment of the present disclosure provides a display panel, the display panel has a display region and a peripheral region surrounding the display region, the peripheral region comprises a first peripheral region, a bending region, and a second peripheral region, the first peripheral region is on a side of the second peripheral region close to the display region, and the bending region is between the first peripheral region and the second peripheral region; and the display panel comprises a base substrate, a driving circuit layer and an encapsulation layer, the driving circuit layer is on the base substrate; the encapsulation layer is on a side of the driving circuit layer away from the base substrate, the encapsulation layer covers the display region and at least part of the first peripheral region, a portion of the encapsulation layer in the first peripheral region comprises a first encapsulation portion and a second encapsulation portion, and the first encapsulation portion is on a side of the second encapsulation portion close to the display region, in a direction perpendicular to the base substrate, an average thickness of the first encapsulation portion is greater than an average thickness of the second encapsulation portion.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
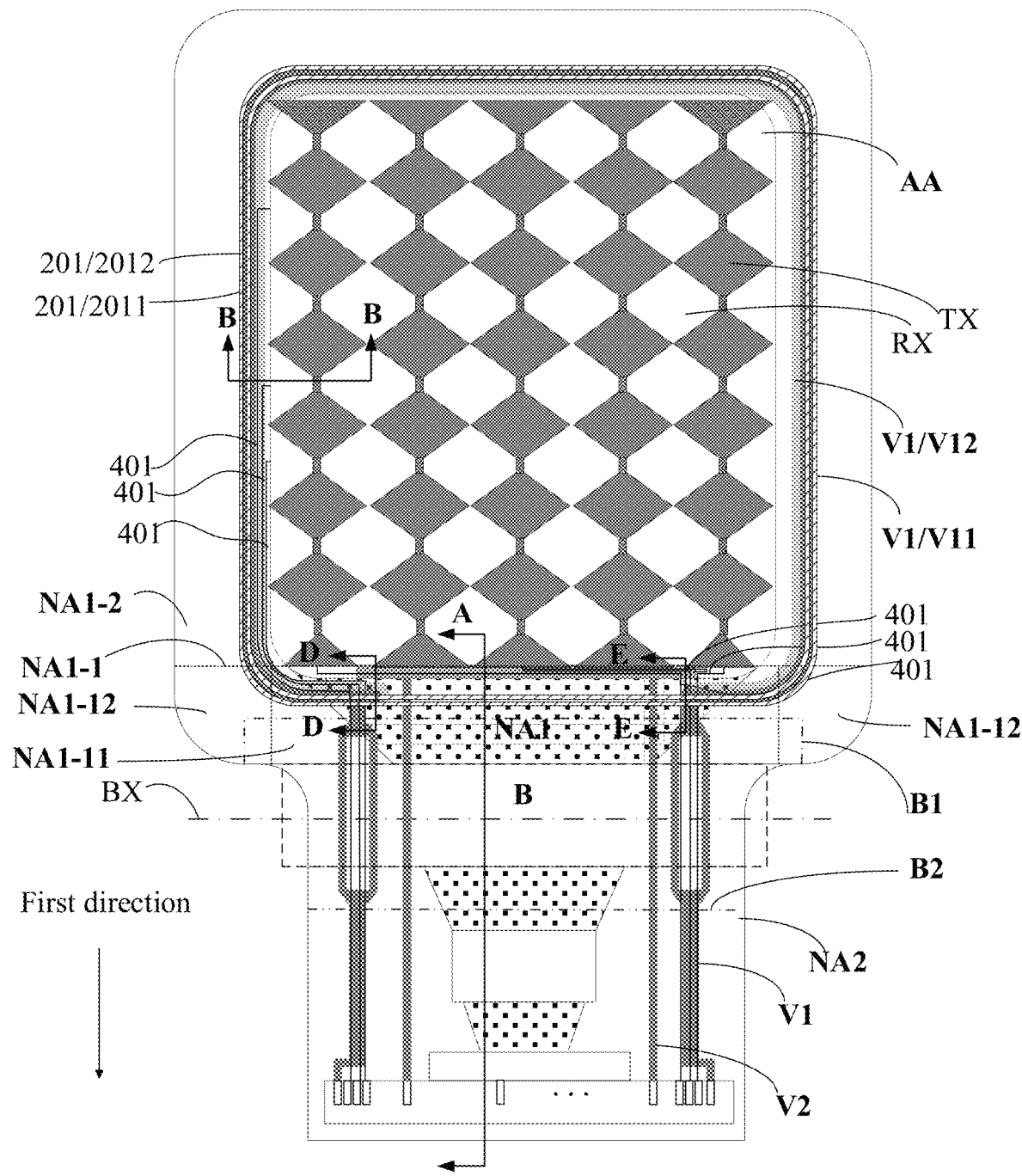
FIG. 1 is a schematic planar diagram of a display panel provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

For a bendable or foldable display panel, FMLOC (flexible metal layer on cell) technology used for the touch structure plays a key role in the reliability of the display panel. For example, in a display panel, an encapsulation layer is used to encapsulate the pixel array including organic materials, and the touch structure may be provided on the encapsulation layer. Since the bendable or foldable display panel has a bending region, when the bending region is undergoing a bending process, bending stress will be generated in the display panel, and the bending stress is likely to cause peeling of the encapsulation layer near the bending region, which adversely affects the touch structure on the encapsulation layer. In addition, the bending region usually has a thick organic material layer. When the touch wire of the touch structure is formed on the organic material layer, since the slope angle of the sidewall of the organic material layer is usually relatively large, during the preparation process of the touch wire, the touch metal used to form the touch wire at the sidewall position is not easily etched accurately, which causes the touch metal remain, so that there will be a short circuit between adjacent touch wires, which causes the accuracy of the touch function to decrease or the touch function to fail.

At least one embodiment of the present disclosure provides a display panel, the display panel has a display region and a peripheral region surrounding the display region, the peripheral region includes a first peripheral region, a bending region, and a second peripheral region, the first peripheral region is on a side of the second peripheral region close to the display region, and the bending region is between the first peripheral region and the second peripheral region. The display panel includes a base substrate, a driving circuit layer, an organic structure, and an encapsulation layer; the driving circuit layer is on the base substrate; the organic structure is on a side of the driving circuit layer away from the base substrate and includes a first organic structure and a second organic structure spaced apart in the peripheral region, the first organic structure is on a side of the second organic structure close to the display region, the first organic structure is in the first peripheral region, and the second organic structure includes a first portion in the first peripheral region and a second portion in the bending region which are continuous; and the encapsulation layer is on a side of the organic structure away from the base substrate, the encapsulation layer covers the display region and at least part of the first peripheral region, the encapsulation layer partially overlaps with the second organic structure in a direction perpendicular to the base substrate, a portion of the encapsulation layer which overlaps with the second organic structure includes a first encapsulation portion and a second encapsulation portion, and the first encapsulation portion is on a side of the second encapsulation portion close to the display region; and in the direction perpendicular to the base substrate, an average thickness of the first encapsulation portion is greater than an average thickness of the second encapsulation portion. Compared with the encapsulation layer of uniform thickness, the encapsulation layer of the display panel has a better encapsulation effect, and is not easy to be peeled off when the display panel is bent; and when the touch wire is formed on the encapsulation layer, the touch wire can be formed by precise etching, so as to avoid problems such as the short circuit between adjacent touch wires in the formed touch wires.

Hereinafter, the display panel provided by the present disclosure will be exemplarily described through several specific embodiments.

At least one embodiment of the present disclosure provides a display panel. FIG. 1 shows a schematic planar diagram of a display panel, FIG. 2 shows a schematic partial cross-sectional diagram of the display panel, and for example, the schematic cross-sectional view is taken along a line A-A in FIG. 1.

Figure 2:
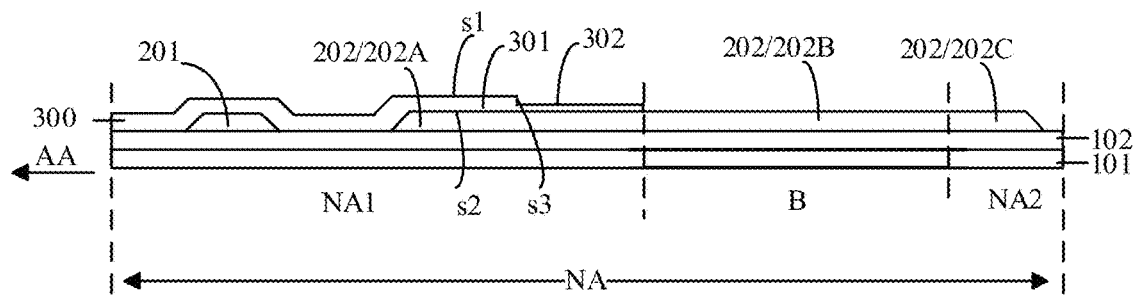
FIG. 2 is a schematic cross-sectional view of the display panel in FIG. 1 along a line A-A.

For example, as illustrated in FIG. 1 and FIG. 2, the display panel has a display region AA and a peripheral region NA surrounding the display region AA. The peripheral region NA includes a first peripheral region NA1, a bending region B, and a second peripheral region NA2. The first peripheral region NA1 is located on a side of the second peripheral region NA2 close to the display region AA, and the bending region B is provided between the first peripheral region NA1 and the second peripheral region NA2. The bending region B can be bent along a bending axis BX, so that the second peripheral region NA2 can be bent to the non-display side of the display panel, thereby reducing the area of the non-display region on the display side of the display panel, and further realizing the large screen and narrow frame design of the display panel. For example, the second peripheral region NA2 may be provided with structures such as a driver chip (IC) and a flexible circuit board (FPC) for controlling display of the display region AA.

For example, as illustrated in FIG. 2, the display panel includes a base substrate 101, a driving circuit layer 102, an organic structure, and an encapsulation layer 300. The driving circuit layer 102 is provided on the base substrate 101. The organic structure is on a side of the driving circuit layer 102 away from the base substrate 101, and the organic structure includes a first organic structure 201 and a second organic structure 202 spaced apart in the peripheral region NA. The first organic structure 201 is located on a side of the second organic structure 202 close to the display region AA, the first organic structure 201 is located in the first peripheral region NA1, the second organic structure 202 includes a first portion 202A located in the first peripheral region NA1 and a second portion 202B located in the bending region B, and the first portion 202A and the second portion 202B are continuous. Alternatively, in some embodiments, the second organic structure 202 includes a first portion 202A located in the first peripheral region NA1, a second portion 202B located in the bending region B, and a third portion 202C located in the second peripheral region NA2, and the first portion 202A, the second portion 202B, and the third portion 202C are continuous.

For example, the encapsulation layer is provided on a side of the organic structure away from the base substrate 101. The encapsulation layer covers the display region AA and at least part of the first peripheral region NA1, and the encapsulation layer partially overlaps with the second organic structure 202 in a direction perpendicular to the base substrate 101. For example, the portion of the encapsulation layer overlapping with the second organic structure 202 includes a first encapsulation portion 301 and a second encapsulation portion 302, and the first encapsulation portion 301 is located on a side of the second encapsulation portion 302 close to the display region AA. In the direction perpendicular to the base substrate 101, the average thickness of the first encapsulation portion 301 is greater than the average thickness of the second encapsulation portion 302.

It should be noted that, in each embodiment of the present disclosure, the thickness of a structure represents the size of the structure in the direction perpendicular to the base substrate 101. For example, for the average thickness of the first encapsulation portion 301, as illustrated in FIG. 2, the surface of the first encapsulation portion 301 away from the base substrate 101 is defined as a top surface s1, the surface of the first encapsulation portion 301 close to the base substrate 101 is defined as a bottom surface s2, and neither the top surface s1 nor the bottom surface s2 includes the sidewall s3 between the top surface s1 and the bottom surface s2. When the top surface and the bottom surface are both flat surfaces, the average thickness of the first encapsulation portion 301 is the distance from the top surface to the bottom surface; when the top surface of the first encapsulation portion 301 is an uneven surface, and the bottom surface is a flat surface, the average thickness of the first encapsulation portion 301 is the average value of the distance from each position of the top surface to the bottom surface. Alternatively, the first encapsulation portion is divided into a plurality of regions with substantially the same size, the distance between the top surface and the bottom surface of a central position in each region is taken as the thickness of the region, and the average value of the thicknesses of the plurality of regions is taken as the average thickness of the first encapsulation portion. The average thickness of the second encapsulation portion 302 is similar to the above, and other average thicknesses appearing in the present disclosure are all similar to the above. In addition, the driving circuit layer 102 may include one or more insulating layers and one or more conductive layers. The one or more conductive layers are used to form structures such as a circuit element, a wire, or the like. For example, two conductive layers separated by the insulating layer can be electrically connected through a via in the insulating layer. For clarity, in FIG. 2, the driving circuit layer 102 is illustrated as one layer as a whole.

For example, the first encapsulation portion 301 and the second encapsulation portion 302 may be a continuous structure, and at least part of the bottom surface of the first encapsulation portion 301 and the bottom surface of the second encapsulation portion 302 are located on the same plane. For at least part of the first encapsulation portion 301 and the second encapsulation portion 302 which are located on the same plane, since the average thickness of the first encapsulation portion 301 is greater than the average thickness of the second encapsulation portion 302, in this case, the distance from at least part of the top surface of the second encapsulation portion 302 to the base substrate 101 is smaller than the distance from the top surface of the first encapsulation portion 301 to the base substrate 101.

For example, in some embodiments, as illustrated in FIG. 2, each of the first encapsulation portion 301 and the second encapsulation portion 302 has a flat surface. In the direction perpendicular to the base substrate 101, the thickness of the first encapsulation portion 301 is the first thickness, the thickness of the second encapsulation portion 302 is the second thickness, and the first thickness is greater than the second thickness. In this case, the distance between the top surface of the second encapsulation portion 302 and the base substrate 101 is smaller than the distance between the top surface of the first encapsulation portion 301 and the base substrate 101, and the first encapsulation portion 301 and the second encapsulation portion 302 are step-shaped as a whole.

Figure 3:
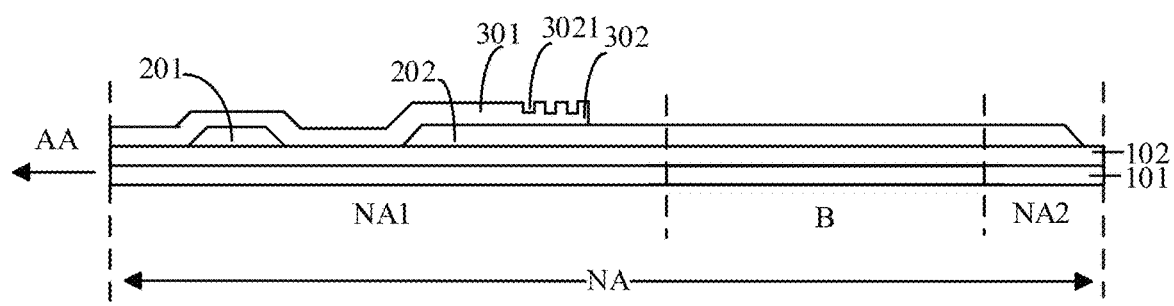
FIG. 3 is another schematic cross-sectional view of the display panel in FIG. 1 along the line A-A.

For example, in some embodiments, as illustrated in FIG. 3, the first encapsulation portion 301 has a flat surface, and the surface of the second encapsulation portion 302 has a concave-convex design, so that the average thickness of the second encapsulation portion 302 is smaller than the thickness of the first encapsulation portion 301.

For example, as illustrated in FIG. 3, the surface of the second encapsulation portion 302 has at least one first groove 3021, and the at least one first groove 3021 extends along a direction parallel to a bending axis BX of the bending region B (that is, along the horizontal direction in FIG. 1). In the direction perpendicular to the base substrate 101, the thickness of the first encapsulation portion 301 is the first thickness, the average thickness of the second encapsulation portion 302 is the second thickness, and the first thickness is greater than the second thickness. In this case, at least part of the bottom surface of the first encapsulation portion 301 and the bottom surface of the second encapsulation portion 302 are located on the same plane. For the at least part of the first encapsulation portion 301 and the second encapsulation portion 302 which are located on the same plane, the top surface of the first encapsulation portion 301 and the top surface of the second encapsulation portion 302 except for the at least one first groove 3021 have the same distance from the base substrate 101, and the distance between the top surface of the at least one first groove 3021 of the second encapsulation portion 302 and the base substrate 101 is smaller than the distance between the top surface of the first encapsulation portion 301 and the base substrate 101.

For example, in some embodiments, the plurality of first grooves 3021 may be distributed in an array or in a strip shape. For example, in some examples, one groove 3021 includes a plurality of rectangular portions arranged in an array along the extending direction of the groove 3021, or one groove 3021 is continuously arranged in a strip shape in the extending direction.

For example, in some embodiments, the direction from the display region AA to the bending region B is taken as the first direction, the second encapsulation portion 302 includes a plurality of encapsulation regions sequentially arranged along the first direction, and average thicknesses of the plurality of encapsulation regions gradually decrease in the first direction.

For example, in some examples, the second encapsulation portion 302 has a top surface that is inclined with respect to the base substrate 101, and in the first direction, the distance from the top surface to the base substrate 101 gradually decreases.

For example, in some examples, the second encapsulation portion 302 includes a plurality of encapsulation regions sequentially arranged along the first direction, the at least one first groove 3021 includes a plurality of first grooves respectively provided in the plurality of encapsulation regions, and the plurality of grooves are arranged to allow the average thicknesses of the plurality of encapsulation regions to gradually decrease in the first direction.

Figure 4:
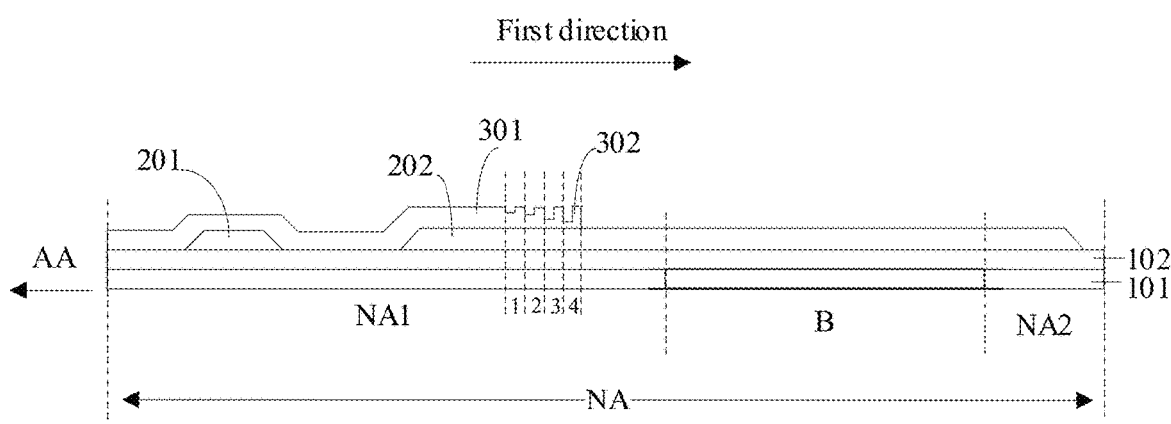
FIG. 4 is still another schematic cross-sectional view of the display panel in FIG. 1 along the line A-A.

For example, as illustrated in FIG. 4, the second encapsulation portion 302 includes a plurality of encapsulation regions arranged sequentially along the first direction, such as encapsulation regions 1, 2, 3, and 4, a plurality of grooves 3021 are respectively provided in the encapsulation regions 1, 2, 3, and 4, and in the first direction, the depths of the grooves 3021 respectively provided in the encapsulation regions 1, 2, 3, and 4 gradually increase, so that the average thicknesses of the encapsulation regions 1, 2, 3, and 4 in the first direction gradually becomes smaller, that is, with a gradual thickness design.

Figure 5:
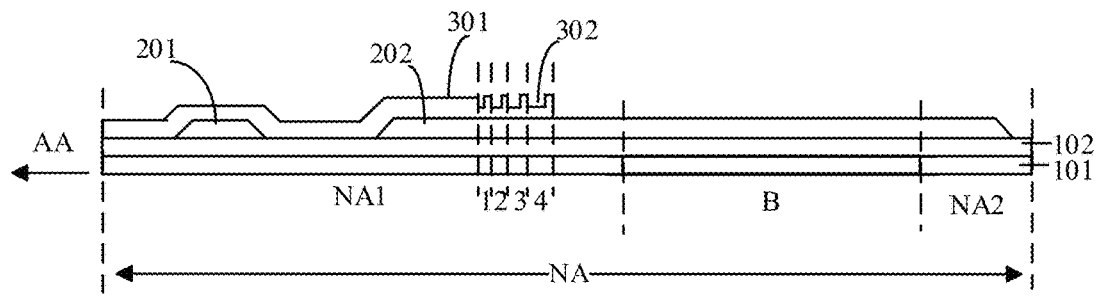
FIG. 5 is still another schematic cross-sectional view of the display panel in FIG. 1 along the line A-A.

For example, in some other embodiments, as illustrated in FIG. 5, the second encapsulation portion 302 includes a plurality of encapsulation regions arranged sequentially along the first direction, such as encapsulation regions 1, 2, 3, and 4, a plurality of grooves 3021 are respectively provided in the encapsulation regions 1, 2, 3, and 4, and in the first direction, the widths of the grooves 3021 respectively provided in the encapsulation regions 1, 2, 3, and 4 gradually increase, so that the average thicknesses of the encapsulation regions gradually becomes smaller in the first direction. The embodiments of the present disclosure do not limit the specific manner in which the thicknesses of the encapsulation regions of the second encapsulation portion 302 are gradually changed.

For example, in some embodiments, the first encapsulation portion 301 may also have a plurality of encapsulation regions, and have the above-mentioned design similar to the second encapsulation portion 302. For example, a groove 3021 is provided in each encapsulation region of the first encapsulation structure 301, to form a gradual thickness design. In this case, in the first direction, from the plurality of encapsulation regions of the first encapsulation portion to the plurality of encapsulation regions of the second encapsulation portion, the average thickness of each region gradually decreases.

Figure 9:
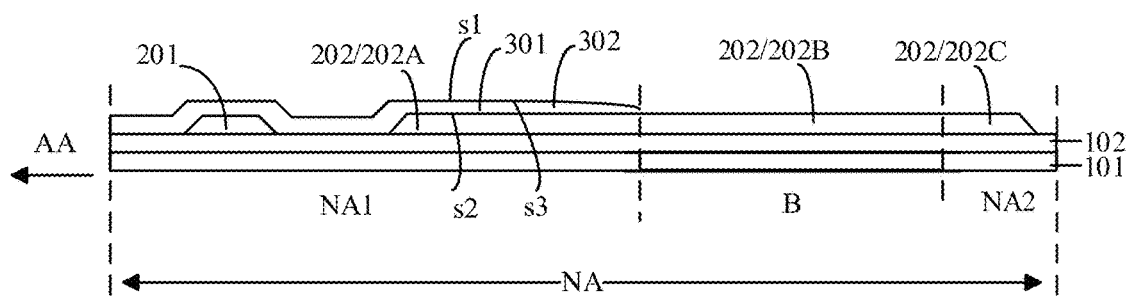
FIG. 9 is still another schematic cross-sectional view of the display panel in FIG. 1 along the line A-A.
Figure 10:
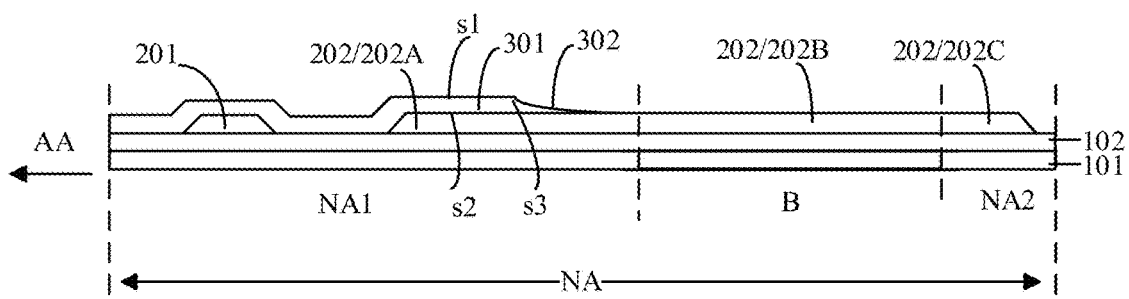
FIG. 10 is still another schematic cross-sectional view of the display panel in FIG. 1 along the line A-A.
Figure 11:
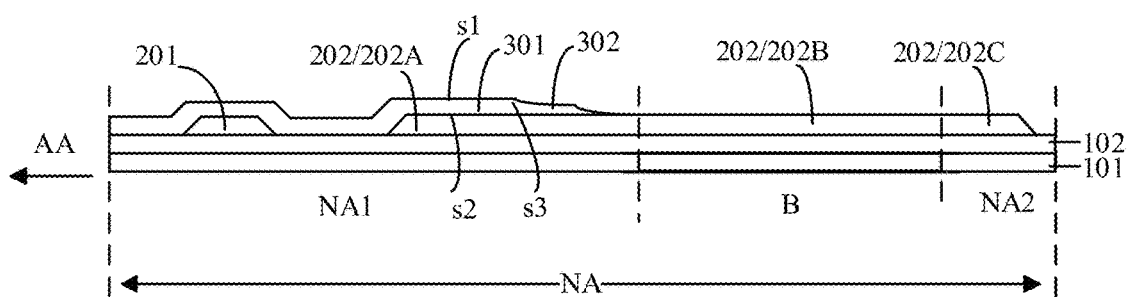
FIG. 11 is still another schematic cross-sectional view of the display panel in FIG. 1 along the line A-A.

For example, in some embodiments, as illustrated in FIG. 9 to FIG. 11, the surface of at least part of the second encapsulation portion 302 away from the base substrate 101 is a curved surface. Compared with the surface of the second encapsulation portion having a uniform slope, the surface of at least part of the second encapsulation portion 302 away from the base substrate 101 is configured as a curved surface, the curved surface is more beneficial to alleviate bending stress.

For example, in some embodiments, as illustrated in FIG. 9, the curved surface is a convex curved surface, or as illustrated in FIG. 10, the curved surface is a concave curved surface.

For example, in some embodiments, the surface of at least part of the second encapsulation portion 302 away from the base substrate 101 has a varying slope in a direction away from the display region AA. For example, the slope of the at least part of the second encapsulation portion 302 gradually decreases from being close to the display region AA to away from the display region AA.

The "slope" referred to herein refers to the tangent value (a tan value) of the acute angle formed between the tangent plane of a certain point on an inclined surface and the horizontal plane where the base substrate 101 is located.

For example, in some embodiments, for the at least part of the second encapsulation portion 302, the slope of the portion close to the display region AA is greater than the slope of the portion away from the display region AA. Since the portion of the second encapsulation portion 302 away from the display region AA is closer to the bending region B and is greatly affected by the stress of the bending region B, the slope of the portion of the second encapsulation portion 302 away from the display region AA is smaller than the slope of the portion of the second encapsulation portion 302 close to the display region AA, and the stress relief effect for the second encapsulation portion close to the bending region B is better, so as to prevent cracks from extending into the encapsulation layer from the portion of the second encapsulation portion close to the bending region. For example, in some embodiments, as illustrated in FIG. 11, the surface of the second encapsulation portion 302 away from the base substrate 101 includes two concave curved regions. In each concave curved region, the slope of the portion close to the display region AA is greater than the slope of the portion away from the display region AA.

For example, in some embodiments, as illustrated in FIG. 10, a slope difference between a maximum value and a minimum value of the slope of the surface of the at least part of the second encapsulation portion 302 away from the base substrate is greater than 0 and smaller than 0.2. For example, a difference between the maximum slope of the portion, close to the display region AA, of the surface of the second encapsulation portion 302 away from the base substrate 101 and the minimum slope of the portion, away from the display region AA, of the surface of the second encapsulation portion 302 away from the base substrate 101 is greater than 0 and less than 0.2. For example, the maximum slope of the portion, close to the display region AA, of the surface of the second encapsulation portion 302 away from the base substrate 101 is 0.1~0.2, and the minimum slope of the portion, away from the display region AA, of the surface of the second encapsulation portion 302 away from the base substrate 101 is 0~0.1. If the slope difference is greater than 0.2, the level difference of the second encapsulation portion 302 at the position with a large slope will cause the touch wire formed on the second encapsulation portion 302 to be broken. The slope difference is kept within a range greater than 0 and less than 0.2, which facilitates ensuring the continuity of the touch wire.

For example, in some embodiments, as illustrated in FIG. 11, the surface of the second encapsulation portion 302 away from the base substrate 101 includes two concave curved regions. In each concave curved region, the difference between the maximum slope and the minimum slope is greater than 0 and less than 0.2.

Figure 7:
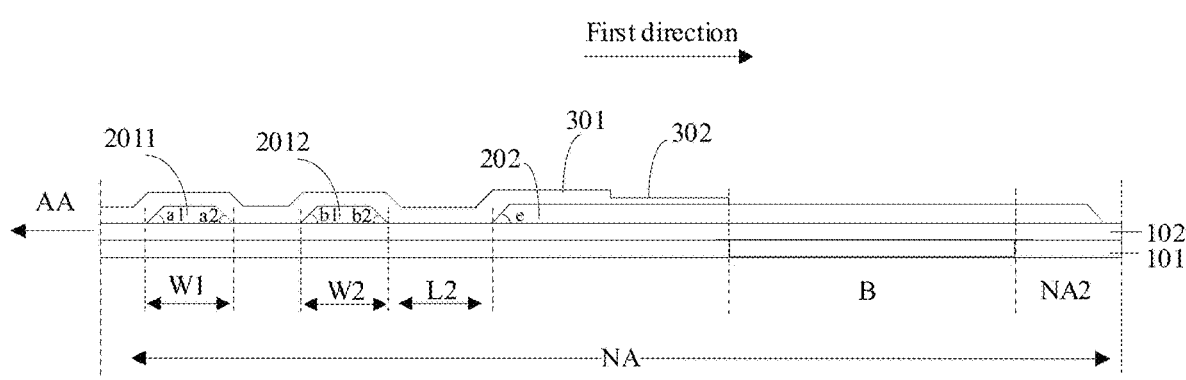
FIG. 7 is still another schematic cross-sectional view of the display panel in FIG. 1 along the line A-A.

For example, in some embodiments, as illustrated in FIG. 7 and FIG. 11, the average slope of the sidewall (the sidewall corresponding to the inclination angle e) of the second organic structure 202 close to the first organic structure 201 is greater than twice the average slope of the surface of the second encapsulation portion 302 away from the base substrate 101. For example, the average slope of the sidewall of the second organic structure 202 on the side close to the first organic structure 201 is 0.2~0.6, and the average slope of the surface of the second encapsulation portion 302 away from the base substrate 101 is 0.001~0.1, that is, the touch wire is formed on the second encapsulation portion 302. The portion, close to the bending region B, of the surface of the touch wire away from the base substrate 101 has a smaller slope compared with the touch wire at the sidewall position of the second encapsulation portion 302, which facilitates alleviating the bending stress when the display panel is bent.

For example, in some embodiments, as illustrated in FIG. 1, the first peripheral region NA1 includes a first sub-peripheral region NA1-1 (illustrated as the first sub-peripheral region NA1-1 being located on the lower side of the display region AA in the figure) and a second sub-peripheral region NA1-2 other than the first sub-peripheral region NA1-1 (illustrated as the second sub-peripheral region NA1-2 being located on the left, upper, and right side of the display region AA in the figure). The average thickness of the encapsulation layer located in the first sub-peripheral region NA1-1 is smaller than the average thickness of the encapsulation layer located in the second sub-peripheral region NA1-2. For example, the average thickness of the encapsulation layer in the second sub-peripheral region NA1-2 is greater than or equal to the average thickness of the first encapsulation portion 301. Since the first sub-peripheral region NA1-1 is close to the bending region B, the encapsulation layer located in the first sub-peripheral region NA1-1 has a smaller thickness than the encapsulation layer farther from the bending region B, which facilitates the bending of the bending region B and allowing the bending region B to maintain the state of the encapsulation layer when the bending region B is bent, so as to avoid warping, peeling, or the like.

For example, in some embodiments, the first sub-peripheral region NA1-1 includes a main region NA1-11 and two corner regions NA1-12, and the two corner regions NA1-12 are respectively located on both sides of the main region NA1-11. The corner region is located between the first sub-peripheral region NA1-1 and the second sub-peripheral region NA1-2, and the average thickness of the encapsulation layer located in the corner region NA1-12 is smaller than the average thickness of the encapsulation layer located in the second sub-peripheral region NA1-2, and is greater than the average thickness of the encapsulation layer located in the main region NA1-11. For example, the corner region NA1-12 is equivalent to the transition region between the first sub-peripheral region NA1-1 and the second sub-peripheral region NA1-2, the transition region is not adjacent to the bending region B, and thus the thickness can be designed larger to ensure a certain encapsulation effect.

For example, in some embodiments, the second organic structure includes a first portion 202A located in the first peripheral region NA1, a second portion 202B located in the bending region B, and a third portion 202C located in the second peripheral region NA2. As illustrated in FIG. 1, the first portion 202A has a first boundary B1 in the first peripheral region NA1, and the third portion 202C has a second boundary B2 in the second peripheral region NA2; and the first portion 202A and the third portion 202C cover a range of 100 um~400 um on the upper side and lower side of the bending region B. Part of the two corner regions NA1-12 close to the bending region is also covered with the second organic structure 202, and the overlapping portion of the encapsulation layer and the second organic structure in this part region also has the first encapsulation portion and the second encapsulation part. Therefore, the region where the second organic structure 202 is provided in the corner region NA1-12 has an encapsulation layer with a smaller thickness than other regions in the corner region. Similarly, the region where the second organic structure 202 is provided in the main region NA1-11 has an encapsulation layer with a smaller thickness than other regions in the main region NA1-11. However, since the area ratio of the overlapping region of the corner region NA1-12 and the second organic structure occupied in the corner region NA1-12 is smaller than the area ratio of the overlapping region of the main region NA1-11 and the second organic structure occupied in the main region NA1-11, the average thickness of the encapsulation layer in the corner region NA1-12 is smaller than the average thickness of the encapsulation layer in the second sub-peripheral region NA1-2, and is greater than the average thickness of the encapsulation layer in the main region NA1-11.

Figure 6:
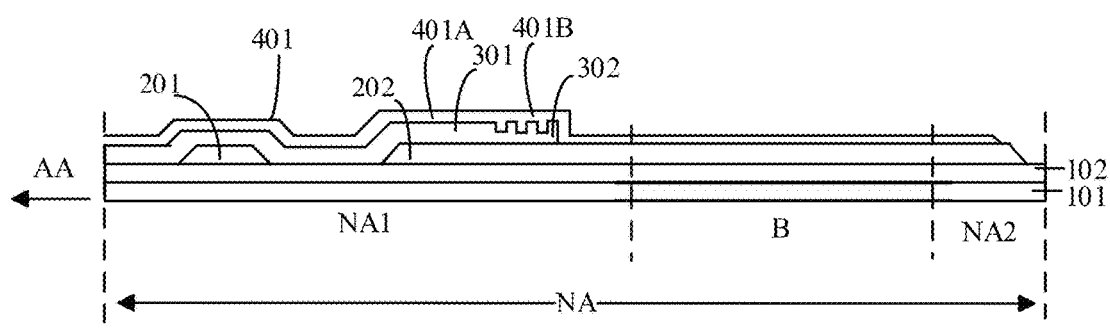
FIG. 6 is still another schematic cross-sectional view of the display panel in FIG. 1 along the line A-A.

For example, in some embodiments, as illustrated in FIG. 1 and FIG. 6, the display panel may further include a touch layer, and the touch layer includes a touch electrode (for example, a touch driving electrode TX and a touch sensing electrode RX used in a mutual capacitance touch method) and a touch wire 401 electrically connected to the touch electrode. The touch wire 401 extends from the display region AA to the second peripheral region NA2. For example, as illustrated in FIG. 6, at least part of the touch wire 401 is disposed on a side of the encapsulation layer away from the base substrate 101 and overlaps with the second organic structure 202 in the direction perpendicular to the base substrate 101. For example, the touch wire 401 includes a first touch wire portion 401A and a second touch wire portion 401B. The first touch wire portion 401A is located on a side of the first encapsulation portion 301 away from the base substrate 101. The second touch wire portion 401B is located on a side of the second encapsulation portion 302 away from the base substrate 101. In this case, since the average thickness of the first encapsulation portion 301 is greater than the average thickness of the second encapsulation portion 302, the average distance from the surface of the first touch wire portion 401A away from the base substrate 101 to the base substrate 101 is greater than the average distance from the surface of the second touch wire portion 401B away from the base substrate 101 to the base substrate 101.

For example, as illustrated in FIG. 6, the second touch wire portion 401B of the touch wire 401 directly contacts the at least one first groove 302. For example, in the preparation process of the touch wire 401, the touch wire 401 is formed directly above the encapsulation layer, so that the second touch wire portion 401B of the touch wire 401 can directly contact the at least one first groove 302, that is, the material of the second touch wire portion 401B is filled into the at least one first groove 302. Thus, the contact area between the touch wire 401 and the second encapsulation portion 302 is increased, so that the extension path of the touch wire 401 on the encapsulation layer can be increased. When the bending region B is bent, it is beneficial to release the stress of the touch wire 401, so as to avoid damage to the touch wire 401.

For example, in some embodiments, as illustrated in FIG. 7, the first organic structure 201 includes a first dam 2011 and a second dam 2012 arranged at an interval, the first dam 2011 and the second dam 2012 protrude in a direction away from the base substrate 101, and the first dam 2011 is located on a side of the second dam 2012 close to the display region AA. The direction from the display region AA to the bending region B is taken as the first direction; and in the first direction, the first dam 2011 has a first width W1, the second dam 2012 has a second width W2, and the minimum distance between the second organic structure 202 and the second dam 2012 is L2, and L2>0.5*(W1+W2). For example, L2 is 120 μm~250 μm, further 130 μm~220 μm, such as 150 μm. For example, each of W1 and W2 is 10 μm~80 μm, further 25 μm~70 μm, such as 40 μm. Therefore, the requirement of the encapsulation layer to block impurities such as water and oxygen can be fully satisfied.

For example, in some embodiments, as illustrated in FIG. 7, the first dam 2011 and the second dam 2012 respectively include the first sidewall and the second sidewall, which are opposite. The second organic structure 202 includes a third sidewall on the side close to the first organic structure 2011, and the first encapsulation portion 301 at least covers the third sidewall. The first sidewall, the second sidewall, and the third sidewall form a plurality of slope angles with the plane where the base substrate 101 is located. For example, as illustrated in FIG. 7, the slope angle formed by the first sidewall of the first dam 2011 with the plane where the base substrate 101 is located is a1, the slope angle formed by the second sidewall of the first dam 2011 with the plane where the base substrate 101 is located is a2, the slope angle formed by the first sidewall of the second dam 2012 with the plane where the base substrate 101 is located is b1, the slope angle formed by the second sidewall of the second dam 2012 with the plane where the base substrate 101 is located is b2, and the slope angle formed by the third sidewall of the second organic structure 202 with the plane where the base substrate 101 is located is e. For example, the above-mentioned slope angles a1, a2, b1, b2, and e are all acute angles, and the absolute value of the difference between any two slope angles among the slope angles a1, a2, b1, b2, and e is less than 20°.

For example, in some examples, the slope angles a1, a2, b1, and b2 formed by the first sidewall and second sidewall of the first dam 2011 and the second dam 2012 with the plate surface of the base substrate are 10°~30°, and further, in some examples, the slope angles a1, a2, b1, and b2 are 15°~25°, such as 15°, 20°, 25°, or the like. The slope angle e formed by the third sidewall of the second organic structure 202 with the base substrate is also 10°~30°, and further, in some examples, the slope angles a1, a2, b1, and b2 are 15°~25°, such as 15°, 20°, 25°, or the like. If the thickness of the second organic structure 202 is thick, and the angle difference between the slope angle formed by the third sidewall of the second organic structure 202 and the slope angle formed by the first organic structure is too large, when the touch wire 401 is formed above the encapsulation layer, the touch metal located at a larger slope angle may be difficult to etch, which may result in touch metal remain, thereby causing the short circuit between adjacent touch wires. The above design can reduce the problem of touch metal remain.

Figure 8:
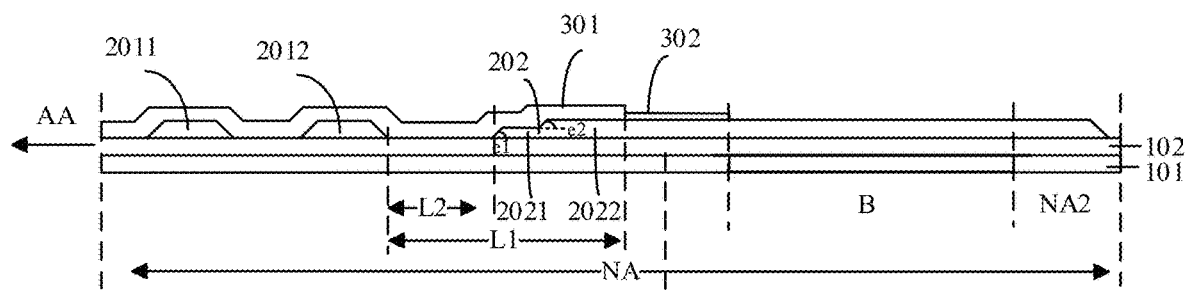
FIG. 8 is still another schematic cross-sectional view of the display panel in FIG. 1 along the line A-A.

For example, in some embodiments, as illustrated in FIG. 8, the third sidewall of the second organic structure 202 is step-shaped as a whole and includes a first step 2021 and a second step 2022, and the second step 2022 is located on a side of the first step 2021 away from the base substrate 101. For example, the slope angle e1 formed by the first step 2021 and the plane where the base substrate 101 is located is smaller than the slope angle e2 formed by the second step 2022 and the plane where the base substrate 101 is located. For example, the slope angle e1 formed by the first step 2021 and the plane where the base substrate 101 is located is 10°~20°, such as 15°, and the slope angle e2 formed by the second step 2022 and the plane where the base substrate 101 is located is 15°~30°, for example 20°. Since the slope angle of the step-shaped third sidewall is small, it is beneficial to the climbing of the encapsulation layer on the step-shaped third sidewall and the climbing of the touch wire on the encapsulation layer, that is, beneficial to the encapsulation layer and the touch wire being formed on the step.

For example, in some embodiments, as illustrated in FIG. 8, the second encapsulation portion 302 ends at a side of the bending region B close to the display region AA. For example, in the direction perpendicular to the base substrate 101, the average thickness of the first encapsulation portion 301 is greater than twice the average thickness of the second encapsulation portion 302. For example, in some examples, the average thickness of the first encapsulation portion 301 is 0.6 μm~1.4 μm, and further is 0.8 μm~1.2 μm, such as 0.8 μm, 1.0 μm, 1.2 μm, etc., and the average thickness of the second encapsulation portion 302 is 0.2 μm~0.5 μm, and further is 0.3 μm~0.4 μm, such as 0.3 μm or 0.4 μm.

For example, in some embodiments, as illustrated in FIG. 8, the minimum distance between the orthographic projection of the second encapsulation portion 302 on the base substrate 101 and the orthographic projection of the second dam 2012 on the base substrate 101 is the first distance L1, the minimum distance between the orthographic projection of the first encapsulation portion 301 on the base substrate 101 and the orthographic projection of the second dam 2012 on the base substrate 101 is the second distance L2, and the first distance L1 is greater than 1.5 times the second distance L2. For example, in some examples, the first distance L1 is 180 μm~375 μm, further is 200 μm~340 μm, such as 280 μm, and the second distance L2 is 120 μm~250 μm, further is 130 μm~220 μm, such as 150 μm.

Therefore, the first encapsulation portion 301 with a relatively greater thickness covers at least the sidewall of the second step 2022. Because the sidewall has an inclined structure, impurities such as water and oxygen are likely to invade along the sidewall. Therefore, ensuring the thickness of the encapsulation layer on the step structure can improve the encapsulation effect of the encapsulation layer.

Figure 12:
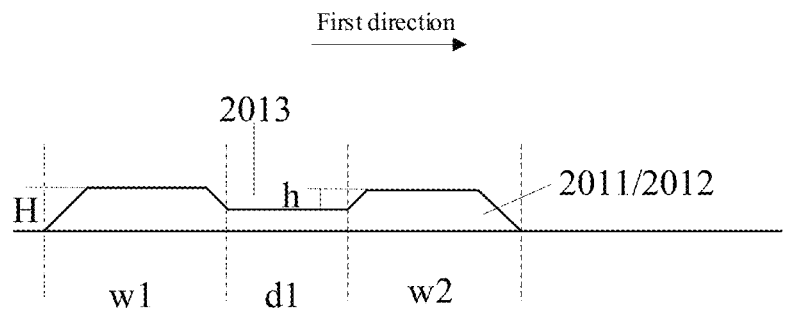
FIG. 12 is a schematic cross-sectional diagram of a first dam or a second dam in a display panel provided by at least one embodiment of the present disclosure.

For example, in some embodiments, as illustrated in FIG. 12, the surface of at least one of the first dam 2011 and the second dam 2012 has at least one second groove 2013, and the at least one second groove 2013 extends in a direction parallel to the bending axis BX of the bending region B. For example, in some examples, the at least one second groove 2013 is continuously arranged in a strip shape in the extending direction thereof. By providing at least one second groove 2013, the contact area between the dam and the encapsulation layer can be increased, so as to further improve the effect of the dam and the encapsulation layer on blocking impurities such as water and oxygen.

For example, in some embodiments, the at least one second groove includes n−1 second grooves, at least one of the first dam and the second dam is divided into n portions by the n−1 second grooves, and n is a positive integer greater than or equal to 2. The direction from the display region AA to the bending region B is taken as the first direction. In the first direction, the widths of the n portions are $w1, w2, \ldots,$ and $wn$, respectively, the widths of the n−1 second grooves are $d1, d2, \ldots,$ and $dn−1$, respectively, d represents at least one of $d1, d2, \ldots,$ and $dn−1$, and $$d < 2 \times (w1 + w2 + \ldots wn)/n;\ w1, w2, \ldots, wn > 0.$$

For example, each of w1, w2, and w3 is 20 μm~80 μm, and each of d1, d2, ..., and dn−1 is 10 μm~60 μm.

For example, n is 3, w1, w2, and w3 are 20 μm, 30 μm, and 40 μm, respectively, and d1 and d2 are 25 μm and 35 μm, respectively.

That is, the width of the second groove is less than twice the average of the widths of the n portions. If the width of the second groove is too large, the blocking effect of the dam may be reduced. Therefore, the contact area between the dam and the encapsulation layer and the blocking effect of the dam can be balanced by the above design.

For example, in some embodiments, the n portions include an i-th portion and a j-th portion, the width of the i-th portion is wi, the width of the j-th portion is wj, there is an i-th groove between the i-th portion and the j-th portion, and the width of the i-th groove is di, and $di > |wi - wj|, 1 \leq i \leq n-1, 1 \leq j \leq n, j=i+1$.

For example, i=2, j=3, w2 and w3 are 30 μm and 40 μm, respectively, and d2 is 25 μm.

When the values of the widths of adjacent portions in the n portions are much different, in order to be able to match the blocking capabilities of portions of different widths, the width of the second groove between the adjacent portions is also increased accordingly.

For example, in some embodiments, w1, w2, . . . , and wn increase in sequence, and the increase value in sequence is W1×(25%~50%).

Figure 13:
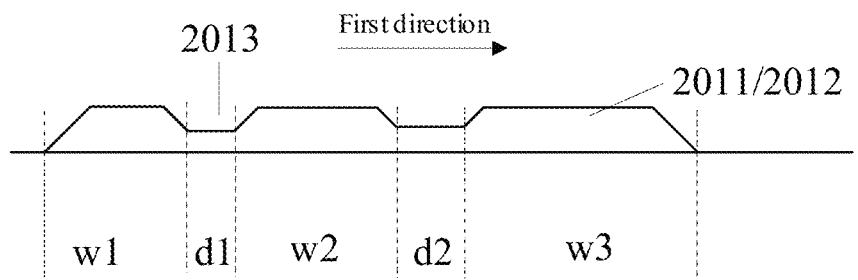
FIG. 13 is another schematic cross-sectional diagram of a first dam or a second dam in a display panel provided by at least one embodiment of the present disclosure.

For example, in an example, as illustrated in FIG. 13, at least one of the first dam 2011 and the second dam 2022 is divided into three portions by two second grooves 2013. In this case, n=3, and the widths w1, w2, and w3 of the three portions are respectively 20 μm, 30 μm, and 40 μm, that is, the increasing amplitude is 50% of w1. The display panel has a greater demand for the blocking effect of the dam on the side close to the display region AA. For example, if the inkjet printing material overflows to the upper surface of the dam, the outflow part can be left inside the second groove, so as to provide the blocking effect. Therefore, the arrangement density of the second grooves close to the display region AA may be greater than the arrangement density of the second grooves away from the display region AA.

For example, in some embodiments, as illustrated in FIG. 12, the thickness of at least one of the first dam 2011 and the second dam 2012 is H, and the depth of the second groove 2013 is h, and $h = k \times H, 0.5 \leq k \leq 1$.

For example, FIG. 12 and FIG. 13 show a situation where k is less than 1. When k is equal to 1, the depth of the second groove 2013 is equal to the thickness of the first dam 2011 and/or the second dam 2012 with the second groove 2013. In this case, the second groove 2013 separates portions of the first dam 2011 and/or the second dam 2012 located on both sides of the second groove 2013.

For example, when K is equal to 1, the width of the first dam 2011 or the second dam 2012 is equal to the sum of w1, w2, . . . , and wn.

Figure 14:
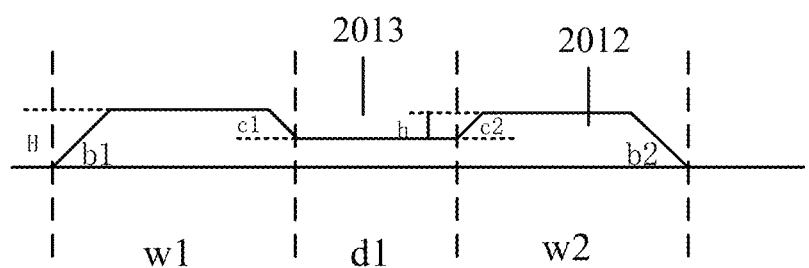
FIG. 14 is still another schematic cross-sectional diagram of a first dam or a second dam in a display panel provided by at least one embodiment of the present disclosure.

For example, in some embodiments, the dam provided with the second groove is the dam on the side close to the bending region B. For example, the surface of the second dam 2012 has at least one second groove 2013. As illustrated in FIG. 14, the second dam 2012 includes a first sidewall and a second sidewall that are opposite, and the first sidewall is closer to the display region AA than the second sidewall. The slope angle formed by the first sidewall and the plane where the base substrate 101 is located is b1, the second groove 2013 includes a third sidewall and a fourth sidewall, the third sidewall of the second groove 2013 is closer to the display region AA than the fourth sidewall, the slope angle formed by the third sidewall of the second groove 2013 and the plane where the base substrate 101 is located is c1, the slope angle formed by the fourth sidewall and the plane where the base substrate 101 is located is c2, and c represents at least one of c1 and c2, and $h/\tan c + H/\tan b1 < w1$, and $\arctan [k \times H/(w1 - H/\tan b1)] < c < 90°$.

For example, w1 is 20 μm~80 μm, each of b1 and b2 is 10°~50°, H is 2 μm~10 μm, and h is 1 μm~10 μm. For example, w1 is 20 μm, b1 is 45°, H is 5 μm, and k is 1.

In this case, $\arctan [1 \times 5/(20 - 5/\tan 45°)] \approx 18.5°$, that is, $18.5° < c < 90°$.

Through the above design, the upper surface of the second groove can have a certain width, and the blocking effect of the second dam 2012 and the contact area between the second dam 2012 and the encapsulation layer can be balanced.

Figure 15:
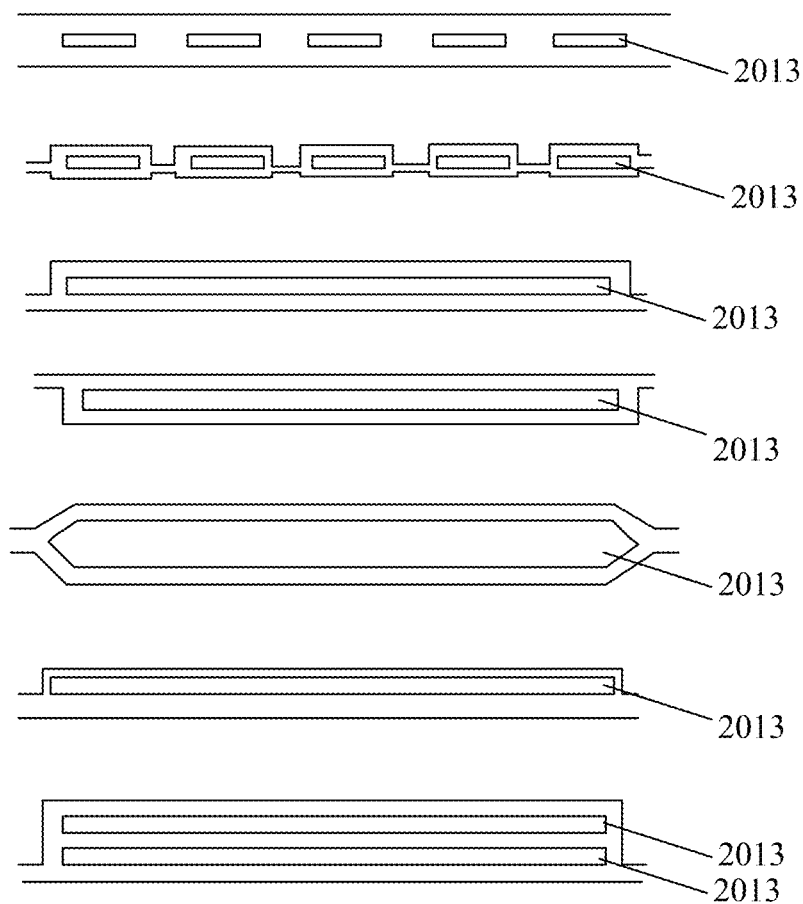
FIG. 15 is a schematic diagram of a shape of a second groove in a first dam or a second dam in a display panel provided by at least one embodiment of the present disclosure.

For example, in some embodiments, the planar shape of the at least one second groove 2013 is rectangular, trapezoidal, or hexagonal, that is, when the at least one second groove 2013 is viewed from a direction perpendicular to the display panel, the at least one second groove 2013 is rectangular, trapezoidal or hexagonal. For example, FIG. 15 shows a schematic diagram of seven shapes of the at least one second groove 2013. For example, the at least one second groove 2013 may be continuously arranged in a strip shape or arranged in an array in the extending direction.

For example, in FIG. 15, in the order from top to bottom, in the first arrangement, the dam with the second grooves 2013 is arranged in a strip shape, a plurality of second grooves 2013 are evenly arranged in the dam, the plurality of second grooves 2013 are arranged in an array in the extending direction (the horizontal direction in the figure), and the planar shape of each second groove 2013 is rectangular.

In the second arrangement, the dam with the second groove 2013 includes a plurality of regions sequentially and continuously arranged in the extending direction, the plurality of second grooves 2013 are arranged in an array in the extending direction and are respectively arranged in the plurality of regions, the planar shape of each second groove 2013 is rectangular, and the dam evenly surrounds each second groove 2013.

In the third arrangement, the dam with the second groove 2013 is arranged in a strip shape, the second groove 2013 divides the dam into two portions with the same width, the second groove 2013 is also arranged in a strip shape, the planar shape of the second groove 2013 is rectangular, and the dam evenly surrounds the second groove 2013 and continues to extend from the lower side of the second groove 2013 in a direction away from the second groove 2013.

In the fourth arrangement, the dam with the second groove 2013 is arranged in a strip shape, the second groove 2013 divides the dam into two portions with the same width, the second groove 2013 is also arranged in a strip shape, the planar shape of the second groove 2013 is rectangular, and the dam evenly surrounds the second groove 2013 and continues to extend from the upper side of the second groove 2013 in a direction away from the second groove 2013.

In the fifth arrangement, the dam with the second groove 2013 is arranged in a strip shape, the second groove 2013 is also arranged in a strip shape, the second groove 2013 divides the dam into two portions with the same width, the planar shapes of the dam and the second groove 2013 are hexagons, and the dam evenly surrounds the second groove 2013 and continues to extend from both ends of the second groove 2013 in a direction away from the second groove 2013.

In the sixth arrangement, the dam with the second groove 2013 is arranged in a strip shape, the second groove 2013 is also arranged in a strip shape, the second groove 2013 divides the dam into two portions with different widths (as shown in the figure that the second groove 2013 divides the dam into two portions with an upper narrow width and a lower wide width, and in other embodiments, the second groove 2013 may also divide the dam into two portions with an upper wide width and a lower narrow width), the planar shape of the second groove 2013 is rectangular, and the dam evenly surrounds the second groove 2013 and continues to extend from the lower side of the second groove 2013 in a direction away from the second groove 2013.

In the seventh arrangement, the dam with the second grooves 2013 is arranged in a strip shape, the dam has two second grooves 2013, the two second grooves 2013 are arranged in a strip shape and divide the dam into three portions with the same width, the planar shape of each second groove 2013 is rectangular, the planar shapes and sizes of the two second grooves 2013 are the same, and the dam evenly surrounds the second groove 2013 and continues to extend from the lower side of the second groove 2013 in a direction away from the second groove 2013.

In other embodiments, the second groove 2013 may also have other arrangements, which are not specifically limited in the embodiments of the present disclosure.

Figure 16:
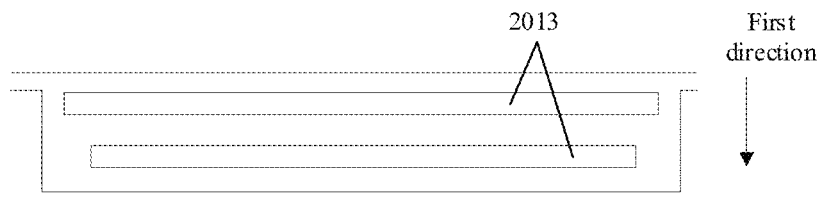
FIG. 16 is a schematic diagram of an arrangement of second grooves in a first dam or a second dam in a display panel provided by at least one embodiment of the present disclosure.

For example, in some embodiments, the at least one second groove 2013 includes a plurality of second grooves 2013. As illustrated in FIG. 16, the direction from the display region AA to the bending region B is taken as the first direction. In the first direction, the plurality of second grooves 2013 (two illustrated in the figure) are arranged in sequence, and the extension lengths gradually decrease.

Figure 17:
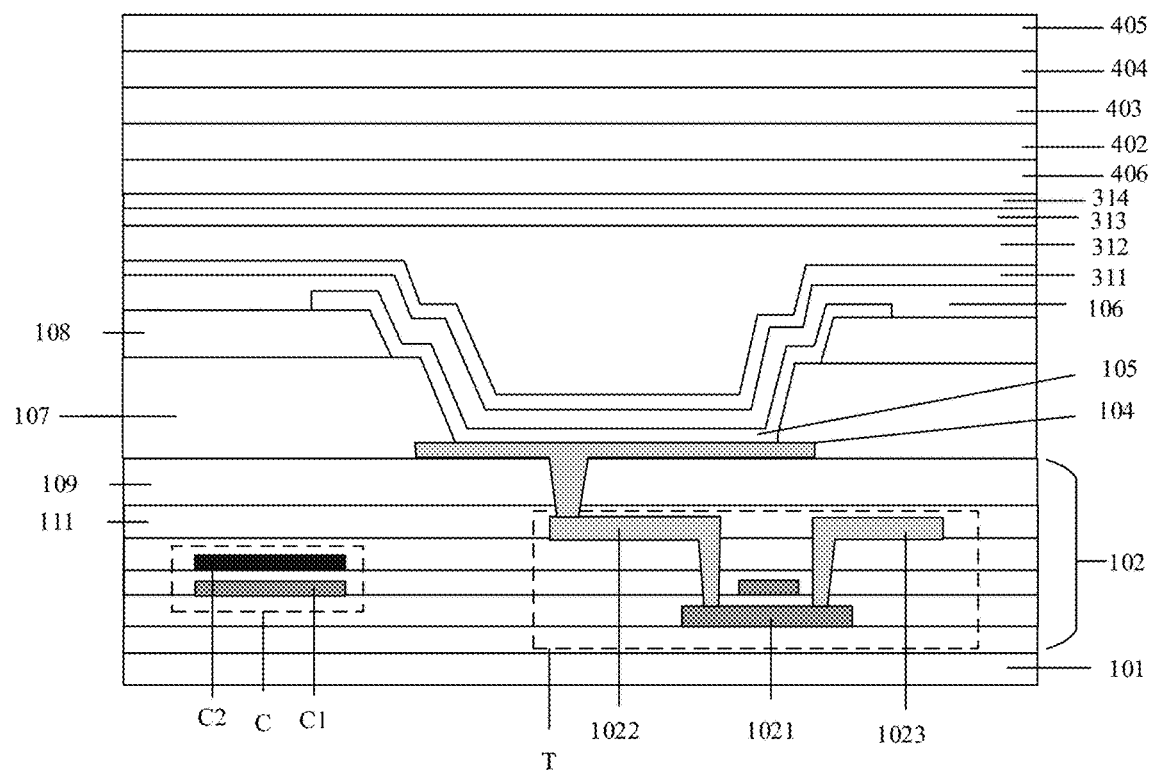
FIG. 17 is a schematic partial cross-sectional diagram of a display region of a display panel provided by at least one embodiment of the present disclosure.

For example, in some embodiments, as illustrated in FIG. 17, the display panel further includes a plurality of sub-pixels arranged in an array, each of the plurality of sub-pixels includes a pixel driving circuit and a light-emitting device, and the pixel driving circuit is disposed in the driving circuit layer 102. For example, the pixel driving circuit includes a thin film transistor T, a storage capacitor C, and other structures. The thin film transistor T includes an active layer, a gate electrode 1021, source-drain electrodes 1022 and 1023, etc. The storage capacitor C includes a first capacitor electrode C1 and a second capacitor electrode C2, the light-emitting device includes a first electrode 104, a second electrode 106, and a light-emitting layer 105 between the first electrode 104 and the second electrode 106, and the first electrode 104 is electrically connected to the source-drain electrode 1022. For example, the first electrode 104 is the anode of the light-emitting device, and the second electrode 106 is the cathode of the light-emitting device. For example, the first capacitor electrode C1 and the gate electrode 1021 are arranged in the same layer.

It should be noted that in the embodiments of the present disclosure, "arranged in the same/identical layer" means that two functional layers or structural layers are formed in the same layer and with the same material in the hierarchical structure of the display substrate, that is, in the preparation process, the two functional layers or structural layers can be formed of the same material layer, and the required pattern and structure can be formed through the same patterning process. The "arranged in the same/identical layer" can simplify the manufacturing process of the display panel.

For example, the active layer may be an amorphous silicon layer, a polysilicon layer, or a metal oxide semiconductor layer (for example, an IGZO layer). For example, the polysilicon may be high temperature polysilicon or low temperature polysilicon. The gate electrode 1021, and the source-drain electrodes 1022 and 1023 may be made of copper (Cu), aluminum (Al), titanium (Ti), or other metal materials or alloy materials, for example, the gate electrode 1021, and the source-drain electrodes 1022 and 1023 may be formed into single-layer structures or multilayer structures, such as structures with three layers of titanium/aluminum/titanium, etc. The material of the first electrode 104 may be transparent metal oxides such as indium tin oxide (ITO), indium zinc oxide (IZO), gallium zinc oxide (GZO), etc., and the material of the second electrode 106 may be lithium (Li), aluminum (Al), magnesium (Mg), silver (Ag), or other metal materials. For example, the base substrate 101 may be a flexible substrate such as polyimide (PI), and structures such as a buffer layer and a barrier layer may also be formed on the base substrate 101. For example, in some examples, the base substrate 101 may be formed as a laminated structure of multiple polyimide (PI) layers. The embodiments of the present disclosure do not limit the material and specific form of each functional structure.

For example, the display panel further includes a first power wire V1 located in the peripheral region NA, and the first power wire V1 is provided in the same layer as the source-drain electrodes 1022 and 1023; or, the first power wire V1 includes a first portion and a second portion connected in parallel, the first portion is arranged in the same layer as the source-drain electrodes 1022 and 1023, and the second portion is arranged in the same layer as the first electrode 104.

Figure 18:
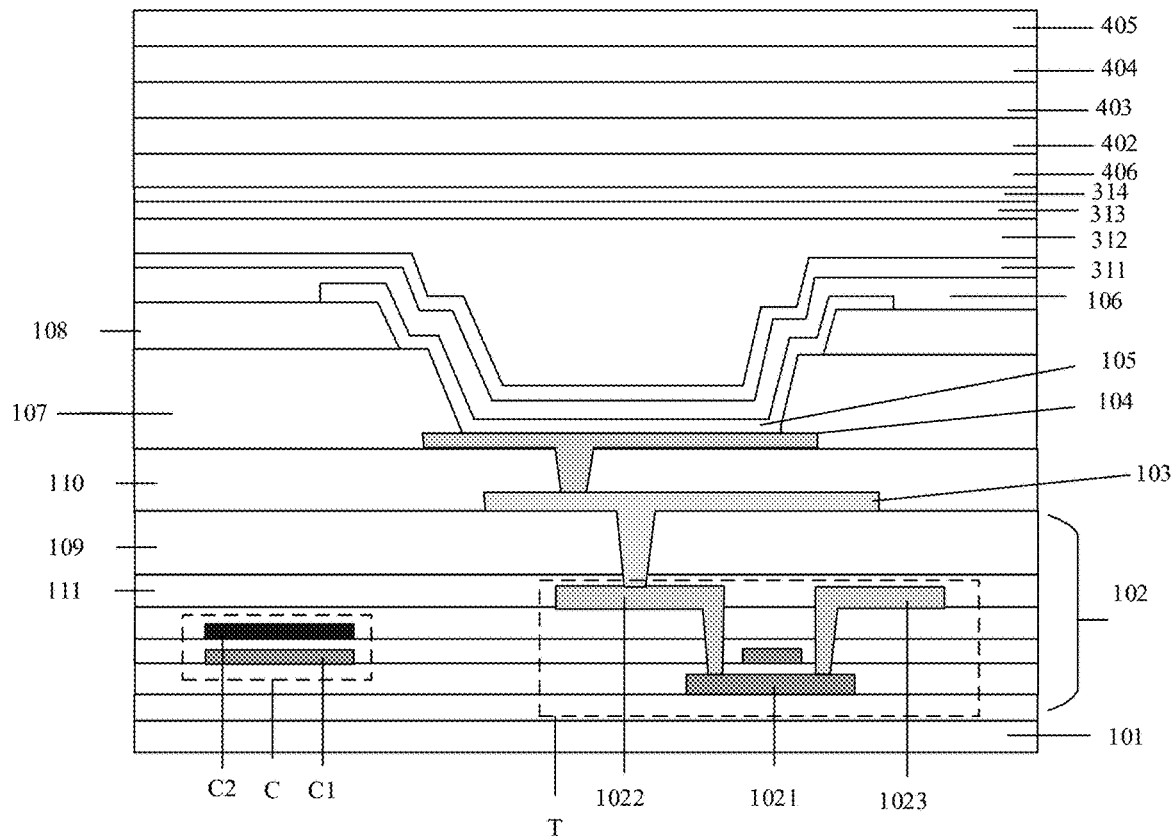
FIG. 18 is another schematic partial cross-sectional diagram of a display region of a display panel provided by at least one embodiment of the present disclosure.

For example, in other embodiments, as illustrated in FIG. 18, the first electrode 104 of the light-emitting device may be electrically connected to the source-drain electrode 1022 through the connection electrode 103. In this case, for example, the first power wire V1 may include a first portion, a second portion, and a third portion connected in parallel. The first portion is arranged in the same layer as the source-drain electrodes 1022 and 1023, the second portion is arranged in the same layer as the first electrode 104, and the third portion is arranged in the same layer as the connection electrode 103. The connection electrode 103 uses, for example, a metal material or an alloy material, such as copper (Cu), aluminum (Al), titanium (Ti), or the like. The aforementioned driving circuit layer 102 only includes the source-drain electrodes 1022 and 1023 and the film layers between the source-drain electrodes 1022 and 1023 and the base substrate 101. In the embodiments of the present disclosure, the connection electrode 103 is used to connect to the source-drain electrode 1022 in the driving circuit layer and the first electrode 104 of the light-emitting device, and does not belong to the aforementioned driving circuit layer.

For example, as illustrated in FIG. 17 and FIG. 18, in some embodiments, the encapsulation layer includes a first inorganic layer 311, a first organic layer 312, a second inorganic layer 313, and a third inorganic layer 314 which are sequentially stacked. The first organic layer 312 is covered (interposed) by the first inorganic layer 311 and the second inorganic layer 313, and the edge of the first organic layer 312 is located on the side of the first organic structure 201 close to the display region AA, that is, the first organic layer 312 ends at a side of the first organic structure 201 close to the display region AA. Each of the first encapsulation portion 301 and the second encapsulation portion 302 includes the first inorganic layer 311, the second inorganic layer 313, and the third inorganic layer 314 which are stacked.

For example, in some embodiments, the encapsulation layer includes a first inorganic layer 311, a first organic layer 312, and a second inorganic layer 313 which are sequentially stacked. The first organic layer 312 is covered (interposed) by the first inorganic layer 311 and the second inorganic layer 313, and the edge of the first organic layer 312 is located on the side of the first organic structure 201 close to the display region AA, that is, the first organic layer 312 ends at a side of the first organic structure 201 close to the display region AA. Each of the first encapsulation portion 301 and the second encapsulation portion 302 includes the first inorganic layer 311 and the second inorganic layer 313 which are stacked.

For example, the material of each of the first inorganic layer 311, the second inorganic layer 313, and the third inorganic layer 314 may include at least one of inorganic materials such as silicon oxide (SiOx), silicon nitride (SiNx), and silicon oxynitride (SiON). The first organic layer 312 includes organic materials such as polyimide and resin. For example, the thickness of the first inorganic layer 311 is 0.5 μmμ1.5 μm, such as 0.8 μm or 1.0 μm, the thickness of the first organic layer 312 is 7 μm~15 μm, such as 10 μm or 12 μm, the thickness of the second inorganic layer 313 is 0.3 μm~0.8 μm, such as 0.5 μm or 0.7 μm, and the thickness of the third inorganic layer 314 is 0.3 μm~0.8 μm, such as 0.5 μm or 0.7 μm.

For example, in other embodiments, the encapsulation layer may also include a first inorganic layer 311, a first organic layer 312, and a second inorganic layer 313 which are sequentially stacked, without the third inorganic layer 314. The embodiments of the present disclosure do not specifically limit the stacked structure of the encapsulation layer.

For example, as illustrated in FIG. 17 and FIG. 18, the display panel may further include a pixel defining layer 107 for defining a plurality of sub-pixels and include a spacer 108. As illustrated in FIG. 17, there may be a first planarization layer 109 between the light-emitting device and the thin film transistor T, the source-drain electrodes 1022 and 1023 are covered by a passivation layer 111, the first planarization layer 109 and the passivation layer 111 have a via exposing the source-drain electrode 1022, and the first electrode 104 is electrically connected to the source-drain electrode 1022 through the via. As illustrated in FIG. 18, there may be a first planarization layer 109 and a second planarization layer 110 between the light-emitting device and the thin film transistor T, the source-drain electrodes 1022 and 1023 are covered by a passivation layer 111, the first planarization layer 109 and the passivation layer 111 have a via exposing the source-drain electrode 1022, and the connection electrode 103 is electrically connected to the source-drain electrode 1022 through the via. The second planarization layer 110 has a via exposing the connection electrode 103, and the first electrode 104 is electrically connected to the connection electrode through the via.

For example, the passivation layer 111 may use at least one of inorganic materials such as silicon oxide (SiOx), silicon nitride (SiNx), and silicon oxynitride (SiON). Each of the pixel defining layer 107, the spacer 108, the first planarization layer 109, and the second planarization layer 110 may include organic materials such as polyimide and resin.

For example, in the manufacturing process of the display panel, the first organic layer 312 in the encapsulation layer can be formed by inkjet printing, and the first organic structure 201 can prevent the first organic layer 312 from overflowing to the peripheral region outside the first organic structure 201 during the printing process. For example, as illustrated in FIG. 1, the first organic structure 201 may be arranged around the peripheral region NA of the display region AA.

For example, for the display panel as illustrated in FIG. 18, the first organic structure 201 may be arranged in the same layer as at least one of the first planarization layer 109, the second planarization layer 110, the pixel defining layer 107, and the spacer 108. For example, the first organic structure 201 is arranged in the same layer as the first planarization layer 109, the second planarization layer 110, and the pixel defining layer 107, or the first organic structure 201 is arranged in the same layer as the first planarization layer 109, the second planarization layer 110 and the spacer 108.

For example, for the display panel as illustrated in FIG. 17, the first organic structure 201 may be arranged in the same layer as at least one of the first planarization layer 109, the pixel defining layer 107, and the spacer 108. For example, the first organic structure 201 is arranged in the same layer as the first planarization layer 109 and the pixel defining layer 107, or the first organic structure 201 is arranged in the same layer as the first planarization layer 109 and the spacer 108, or the first organic structure 201 is arranged in the same layer as the first planarization layer 109, the pixel defining layer 107, and the spacer 108.

For example, in the case where the first organic structure 201 includes the first dam 2011 and the second dam 2012, for the display panel as illustrated in FIG. 18, the first dam 2011 may be arranged in the same layer as the second planarization layer 110, the pixel defining layer 107, and the spacer 108, and the second dam 2012 may be arranged in the same layer as the first planarization layer 109, the second planarization layer 110, the pixel defining layer 107, and the spacer 108; or, the first dam 2011 is arranged in the same layer as the pixel defining layer 107 and the spacer 108, and the second dam 2012 is arranged in the same layer as the first planarization layer 109, the second planarization layer 110, the pixel defining layer 107, and the spacer 108. For the display panel illustrated in FIG. 17, the first dam 2011 may be arranged in the same layer as the pixel defining layer 107 and spacer 108, and the second dam 2012 may be arranged in the same layer as the first planarization layer 109, the pixel defining layer 107, and the spacer 108.

For example, the second organic structure 202 covers the wire structure provided in the bending region B, thereby protecting the wire structure and buffering stress. For example, for the display panel as illustrated in FIG. 18, the second organic structure 202 is arranged in the same layer as at least one of the first planarization layer 109, the second planarization layer 110, the pixel defining layer 107, and the spacer 108. For the display panel illustrated in FIG. 17, the second organic structure 202 is arranged in the same layer as at least one of the first planarization layer 109, the pixel defining layer 107, and the spacer 108.

For example, for the second organic structure 202 having a stepped structure as illustrated in FIG. 8, for the display panel as illustrated in FIG. 18, the first step 2021 of the second organic structure 202 is arranged in the same layer as at least one of the first planarization layer 109, the second planarization layer 110, and the pixel defining layer 107, and the second step 2022 is provided in the same layer as at least one of the second planarization layer 110, the pixel defining layer 107, and the spacer 108. For the display panel illustrated in FIG. 17, the first step 2021 is arranged in the same layer as at least one of the first planarization layer 109 and the pixel defining layer 107, and the second step 2022 is arranged in the same layer as at least one of the pixel defining layer 107 and the spacer 108. For example, in one example, the thickness of the first step 2021 of the second organic structure is greater than the thickness of the second step 2022. For the display panel illustrated in FIG. 18, the first step 2021 is provided in the same layer as the first planarization layer 109 or the second planarization layer 110, and the second step 2022 is provided in the same layer as the pixel defining layer 107. For the display panel illustrated in FIG. 17, the first step 2021 is provided in the same layer as the first planarization layer 109, and the second step 2022 is provided in the same layer as the pixel defining layer 107.

For example, in some embodiments, as illustrated in FIG. 1, in the direction perpendicular to the base substrate 101, the second portion V12 (the light gray portion in the figure) of the first power wire V1 partially overlaps with at least one of the first dam 2011 and the second dam 2012, and the portion of the second portion V12 of the first power wire that overlaps with at least one of the first dam 2011 and the second dam 2012 has at least one opening VH. For example, as illustrated in FIG. 1, the second portion V12 of the first power wire V1 surrounds the upper, left and right sides of the display region AA, and is disconnected at the lower side of the display region AA, or, in some embodiments, the second portion V12 of the first power wire V1 is also continuous at the lower side, thereby forming a ring around the periphery of the display region AA.

Figure 19:
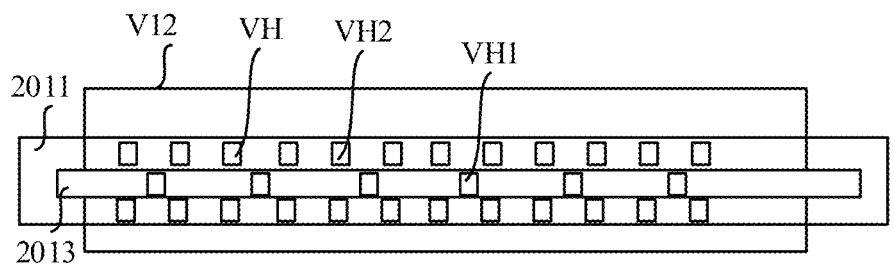
FIG. 19 is a schematic planar diagram of a second portion of a first power wire and a second dam that are overlapped in a display panel provided by at least one embodiment of the present disclosure.

For example, in some embodiments, as illustrated in FIG. 19, the first dam 2011 has a second groove 2013, and a portion of the second portion V12 of the first power wire that overlaps with the first dam 2011 has a plurality of openings VH. Since the organic layer of the display panel releases gas including water molecules during the heating process, and the organic layer has the characteristic of conducting water and oxygen, if the water and oxygen intrude into the light-emitting device in the display region AA, the light-emitting layer of the light-emitting device will be damaged, resulting in defects such as dark spots on the display panel. Since the second portion V12 of the first power wire V1 is usually formed on the side of the organic layer away from the base substrate 101, in some cases, the dam itself is also made of organic materials, so that the second portion V12 of the first power wire V1 is provided with the opening to discharge the gas including water molecules that may be generated during the formation of the organic layer.

For example, in some embodiments, the extending direction of the at least one opening VH is perpendicular to the extending direction of the first dam 2011. For example, in FIG. 19, the extending direction of the second groove 2013 is the horizontal direction in the figure, and the extending direction of the at least one opening VH is the vertical direction in the figure.

Figure 20:
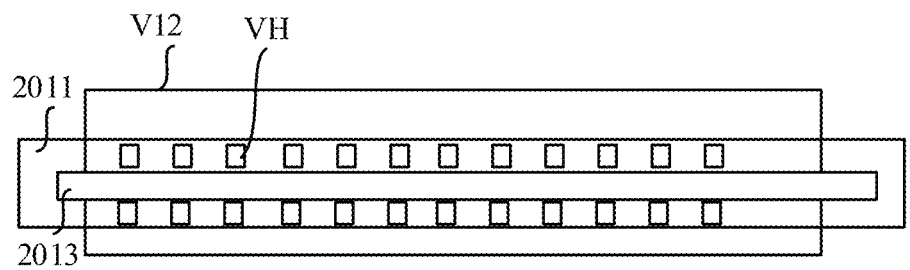
FIG. 20 is another schematic planar diagram of a second portion of a first power wire and a second dam that are overlapped in a display panel provided by at least one embodiment of the present disclosure.

For example, in the direction perpendicular to the base substrate 101, the second portion V12 of the first power wire also partially overlaps with the at least one second groove 2013. As illustrated in FIG. 20, in the case where the depth of the at least one second groove 2013 is equal to the thickness of the first dam 2011, there is no organic material at the position of the second groove 2013, so that the portion of the second portion V12 of the first power wire that overlaps with the at least one second groove 2013 does not have an opening VH, that is, in the direction perpendicular to the base substrate 101, the opening VH does not overlap with the second groove 2013; or, in the case where the depth of the at least one second groove 2013 is less than the thickness of the first dam 2011, the at least one opening VH includes first part openings VH1 and second part openings VH2, a portion of the second portion V12 of the first power wire that overlaps with the at least one second groove 2013 has the first part openings VH1, the second part openings VH2 are the openings in the at least one opening VH except for the first part openings VH1, and the size or arrangement density of the first part openings VH1 is smaller than the size or arrangement density of the second part openings VH2.

Since the dam having the second groove 2013 has less or no organic material, the corresponding position may be provided with fewer/smaller openings VH or no openings VH.

Figure 21:
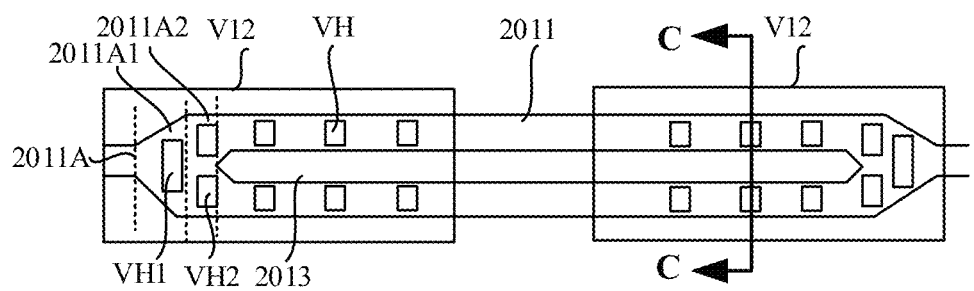
FIG. 21 is still another schematic planar diagram of a second portion of a first power wire and a second dam that are overlapped in a display panel provided by at least one embodiment of the present disclosure.

For example, in some embodiments, as illustrated in FIG. 21, at least one of the first dam 2011 and the second dam 2012 (illustrated as the first dam 2011 in the figure as an example, or the second dam 2012 in other embodiments) includes an edge portion 2011A located at an end of the at least one second groove 2013, and the edge portion 2011A has a gradually changing width. For example, the edge portion 2011A includes a first portion 2011A1 (the left portion of the edge portion 2011A in the figure) and a second portion 2011A2 (the right portion of the edge portion 2011A in the figure), the first portion 2011A1 of the edge portion 2011A is located on a side of the second portion 2011A2 of the edge portion 2011A away from the at least one second groove 2013, the average width of the first portion 2011A1 of the edge portion 2011A (the average size of the first portion in the vertical direction in the figure) is smaller than the average width of the second portion 2011A2 of the edge portion 2011A (the average size of the second portion in the vertical direction in the figure), the extension length of the opening VH1 overlapping with the first portion 2011A1 of the edge portion 2011A (the size in the vertical direction in the figure) is greater than the extension length of the opening VH2 overlapping with the second portion 2011A2 of the edge portion 2011A, and the number of openings VH1 overlapping with the first portion 2011A1 of the edge portion 2011A (illustrated as one in the figure) is less than the number of openings VH2 overlapping with the second portion 2011A2 of the edge portion 2011A (illustrated as two in the figure).

For example, in an example, the second portion V12 of the first power wire has two portions (the left and right portions in FIG. 21), and the two portions are distributed axis-symmetrically, as illustrated in FIG. 21.

Figure 22:
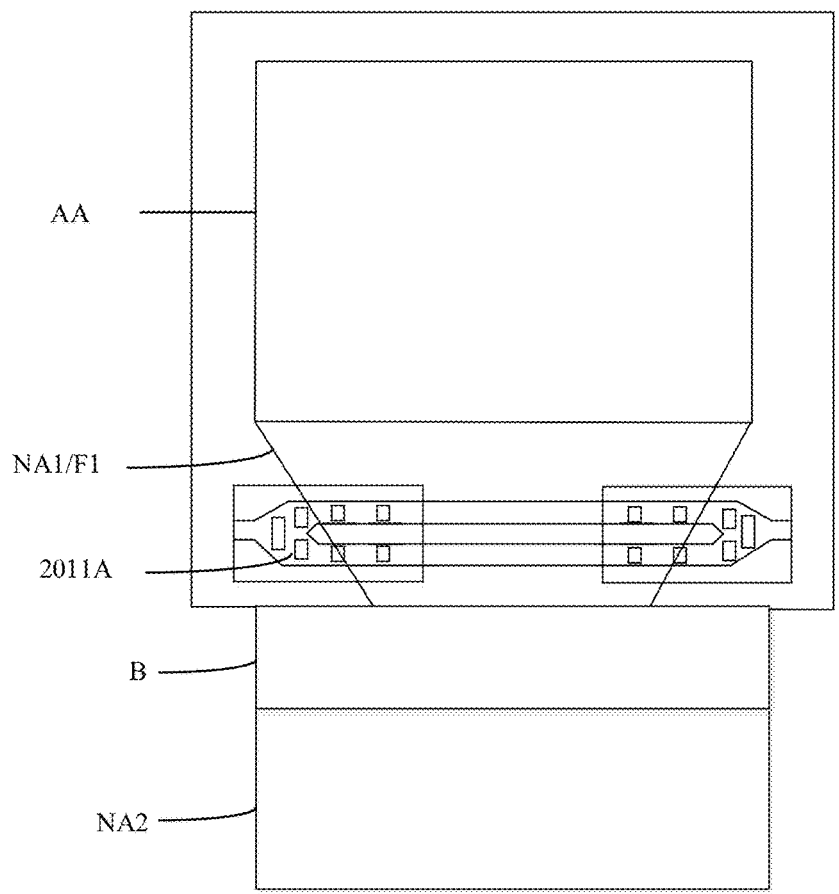
FIG. 22 is a schematic planar diagram of a display panel provided by at least one embodiment of the present disclosure.

For example, as illustrated in FIG. 22, in some embodiments, the display panel further includes a fan-shaped wire region F1 located in the first peripheral region NA1. The fan-shaped wire region F1 includes a plurality of wires for electrically connecting pixel driving circuits in the display region AA to a plurality of wires located in the bending region B. For example, the wires in the fan-shaped wire region F1 are arranged in the same layer as the gate electrode 1021, or arranged in the same layer as the second capacitor electrode C2, or arranged in the same layer as the gate electrode 1021 and the second capacitor electrode C2. In the direction perpendicular to the base substrate 101, the edge portion 2011A does not overlap with the fan-shaped wire region F1. Therefore, in the direction perpendicular to the base substrate 101, the first dam 2011 overlaps with the fan-shaped wire region F1, that is, the first dam 2011 covers the fan-shaped wire region F1 to protect the plurality of wires in the fan-shaped wire region F1.

It should be noted that FIG. 22 only shows a schematic diagram of the portion of the dam close to the bending region B. In some embodiments, as illustrated in FIG. 1, the dam (for example, the first dam 2011 and the second dam 2012) is around the display region AA, such as extending from the edge portion 2011A in FIG. 22 to the left and right sides of the display region AA, so as to be continuously arranged around the display region AA to fully provide the blocking effect.

For example, in some embodiments, the extension length of the opening VH (the length in the vertical direction in FIG. 21) is 70%~80% of the width of each part of the first dam 2011 (for example, w1, w2, . . . , and wn). For example, in some embodiments, the width of each part (for example, w1, w2, ..., and wn) ranges from 20 μm to 100 μm, such as 20 μm to 40 μm. For example, in an example, when the width of a part is 40 μm, the length of the opening VH under the part may be 30 μm, the width is 15 μm, and the interval between two adjacent openings VH is 12 μm.

Figure 23:
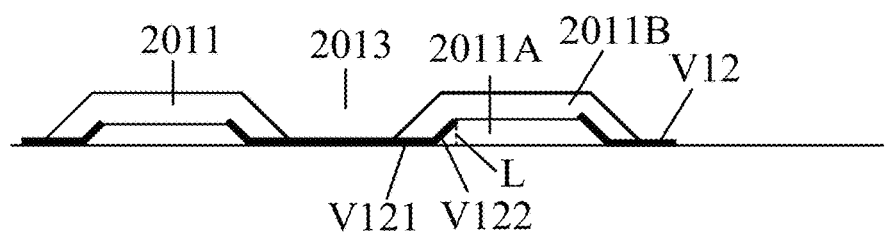
FIG. 23 is a schematic cross-sectional diagram of a second dam in a display panel provided by at least one embodiment of the present disclosure.

For example, FIG. 23 shows a schematic cross-sectional view along a line C-C in FIG. 21. In an example, as illustrated in FIG. 21, the thickness of the first dam 2011 ranges from 1 μm to 6 μm, and the depth of the second groove 2013 is equal to the thickness of the first dam 2011. The first dam 2011 includes a plurality of portions arranged in the same layer as the first planarization layer 109, the pixel defining layer 107, and the spacer 108. For example, the first portion 2011A of the first dam 2011 is arranged in the same layer as the first planarization layer 109, and the second portion 2011B of the first dam 2011 is arranged in the same layer as the pixel defining layer 107 and the spacer 108; or, the first portion 2011A of the first dam 2011 is arranged in the same layer as the first planarization layer 109 and the pixel defining layer 107, and the second portion 2011B of the first dam 2011 is arranged in the same layer as the spacer 108. The second portion V12 of the first power wire is formed between the first portion 2011A and the second portion 2011B of the first dam 2011. The portion of the second portion V12 of the first power wire that overlaps with the first dam 2011 includes a flat portion V121 and a slope portion V122. The slope portion V122 is formed on the sidewall of the first portion 2011A of the first dam 2011, but will not be formed on the upper surface of the first portion 2011A of the first dam 2011, thereby forming the opening VH. For example, the slope portion V122 forms a sloped edge at the edge of the opening VH, and for example, the distance L from the sloped edge (that is, the upper end portion of the slope portion V122) to the bottom surface of the first dam 2011 (the surface close to the base substrate 101) is less than 50% of the thickness of each part of the first dam 2011.

Figure 24:
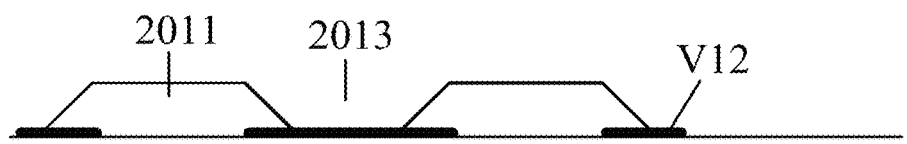
FIG. 24 is another schematic cross-sectional diagram of a second dam in a display panel provided by at least one embodiment of the present disclosure.

For example, in some embodiments, as illustrated in FIG. 24, the second portion V12 of the first power wire may not have a slope portion, that is, may not have an inclined edge. For example, the first dam 2011 includes a plurality of portions arranged in the same layer as the pixel defining layer 107 and the spacer 108. The second portion V12 of the first power wire is arranged below the first dam 2011.

Figure 25:
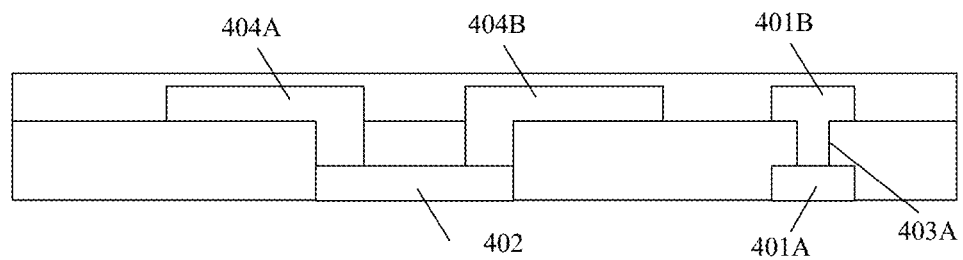
FIG. 25 is a schematic cross-sectional diagram of a touch layer in a display panel provided by at least one embodiment of the present disclosure.

For example, in some embodiments, as illustrated in FIG. 17 and FIG. 18, the display panel further includes a touch layer located on a side of the encapsulation layer away from the base substrate 101, and the touch layer includes a first touch metal layer 402, a touch insulating layer 403, and a second touch metal layer 404 sequentially disposed on the side of the encapsulation layer away from the base substrate 101. With reference to FIG. 1, the second touch metal layer 403 includes a touch driving electrode TX extending in the first direction and a driving sensing electrode RX extending in the second direction, and the first direction intersects the second direction, for example, the first direction is perpendicular the second direction. As illustrated in FIG. 25, the driving sensing electrode TX includes a plurality of separated portions 404A and 404B, and the first touch metal layer 402 includes at least one bridge electrode 402 for electrically connecting the plurality of separated portions 404A and 404B.

For example, the side of the second touch metal layer 404 away from the base substrate is further provided with a protective cover plate 405, such as a glass cover plate, to protect the touch layer and form a touch surface. For example, there is a buffer layer 406 between the touch layer and the encapsulation layer to facilitate the formation of the touch electrode and touch wire. For example, in other embodiments, the buffer layer 406 may not be provided, and the third inorganic layer 314 further serves as the buffer layer.

For example, as illustrated in FIG. 1, the touch layer further includes a touch wire 401 electrically connected to the touch driving electrode TX or the driving sensing electrode RX. For example, FIG. 25 is obtained along a line B-B in FIG. 1. As illustrated in FIG. 25, the touch wire 401 includes a first wire portion 401A located in the first touch metal layer 402 and a second wire portion 401B located in the second touch metal layer 403, there is at least one via 403A in the touch insulating layer 403, and the first wire portion 401A and the second wire portion are electrically connected through the at least one via 403A.

Figure 26:
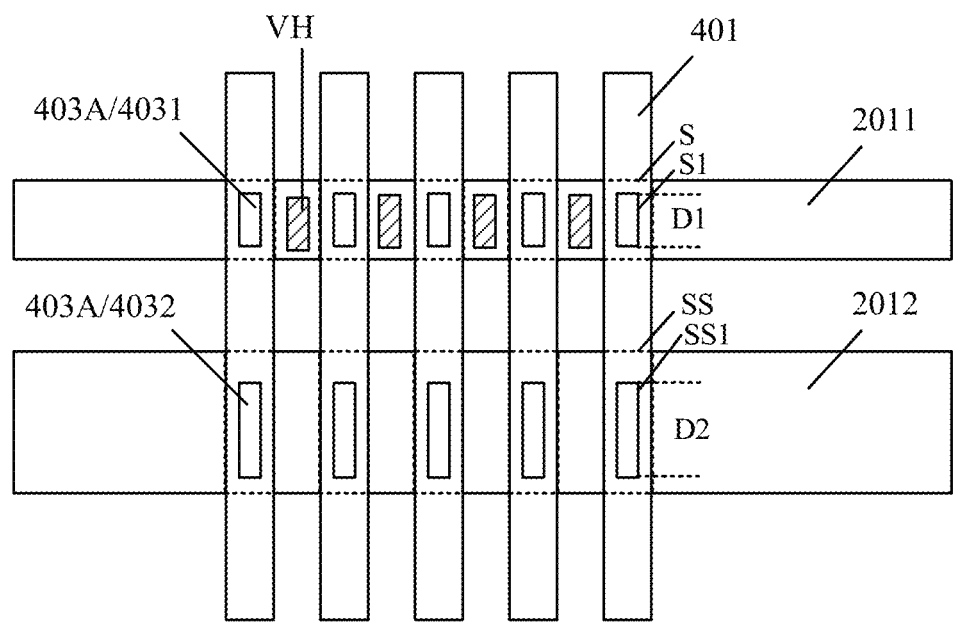
FIG. 26 is a schematic planar diagram of a touch wire overlapping with a first dam and a second dam in a display panel provided by at least one embodiment of the present disclosure.

For example, in some embodiments, as illustrated in FIG. 26, the extending direction (the vertical direction in the figure) of the at least one via 403A is perpendicular to the extending direction of the first dam 2011 and the second dam 2012. In the direction perpendicular to the base substrate 101, the at least one via 403A includes a first via 4031 overlapping with the first dam 2011 and a second via 4032 overlapping with the second dam 2012. The orthographic projection of the first via 4031 on the base substrate 101 is located within the orthographic projection of the first dam 2011 on the base substrate 101 and does not overlap with the edge of the orthographic projection of the first dam 201 on the base substrate 101. The orthographic projection of the second via 4032 on the base substrate 101 is located within the orthographic projection of the second dam 2012 on the base substrate 101 and does not overlap with the edge of the orthographic projection of the second dam 202 on the base substrate 101.

For example, in the direction perpendicular to the base substrate 101, the overlapping area of the touch wire 401 and the first dam 2011 (for example, the area of the region illustrated by the dashed block in the figure) is S, the overlapping area of the first via 4031 and the first dam 2011 (for example, the area of the region illustrated by the solid block in the figure) is S1, and $0.2 < S1/S < 0.4$. The overlapping area of the touch wire 401 and the second dam 2012 (for example, the area of the region illustrated by the dashed block in the figure) is SS, the overlapping area of the second via 4032 and the second dam 2012 (for example, the area of the region illustrated by the solid block in the figure) is SS1, and $0.2 < SS1/SS < 0.4$.

Figure 30:
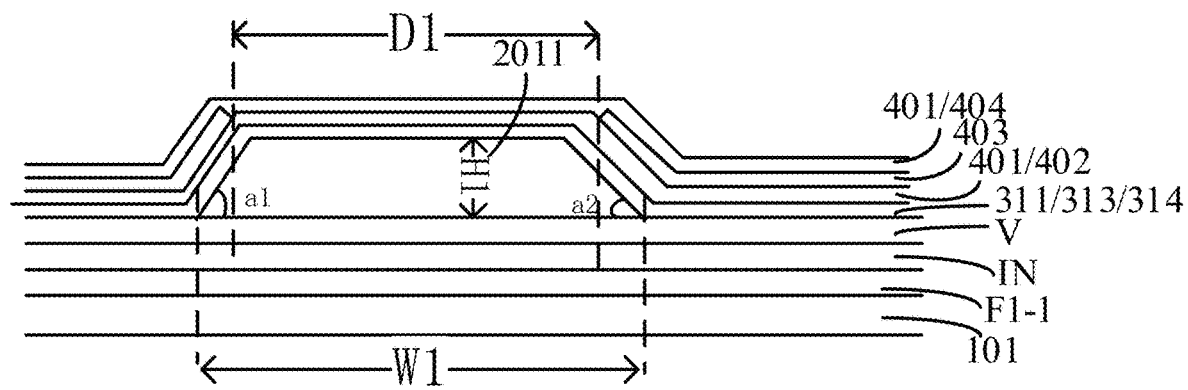
FIG. 30 is a schematic cross-sectional view of the display panel in FIG. 1 along a line E-E.

For example, in some embodiments, as illustrated in FIG. 7, FIG. 26, and FIG. 30, the slope angle formed by the sidewall of the first dam 2011 close to the display region AA and the plane where the base substrate 101 is located is a1, the width of the first dam 2011 is W1, the height of the first dam 2011 is H1, the extension length of the first via 4031 is D1, and $$0.5 < (W1-D1) \times 0.5 \times \tan(a1)/H1 < 0.95.$$

For example, W1 is 40 μm, D1 is 30 μm, H1 is 2 μm, the slope angles a1 and a2 of the two sidewalls of the second dam 2011 are both 20°, and $$(40-30) \times 0.5 \times \tan 20°/2 \approx 0.81.$$

Figure 31:
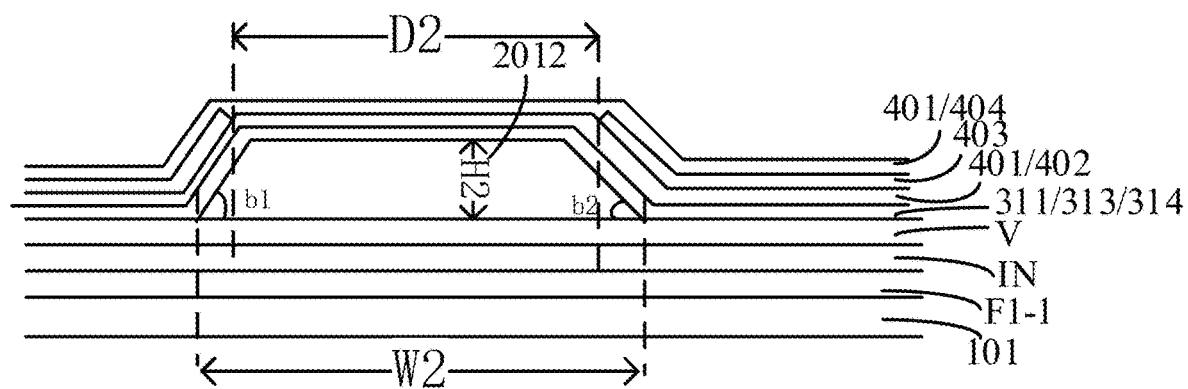
FIG. 31 is another schematic cross-sectional view of the display panel in FIG. 1 along the line E-E.

For example, as illustrated in FIG. 7, the slope angle formed by the sidewall of the second dam 2012 close to the display region AA and the plane where the base substrate 101 is located is b1, the width of the second dam 2012 is W2, the height of the second dam 2012 is H2, as illustrated in FIG. 31, the extension length of the second via 4032 is D2, and $$0.5<(W2-D2)\times 0.5\times \tan(b1)/H2<0.95.$$

For example, W2 is 40 μm, D2 is 30 μm, H2 is 2 μm, the slope angles a1 and a2 of the two sidewalls of the second dam 2011 are both 20°, and $$(40-30)\times 0.5\times \tan 20°/2\approx 0.81.$$

Figure 27:
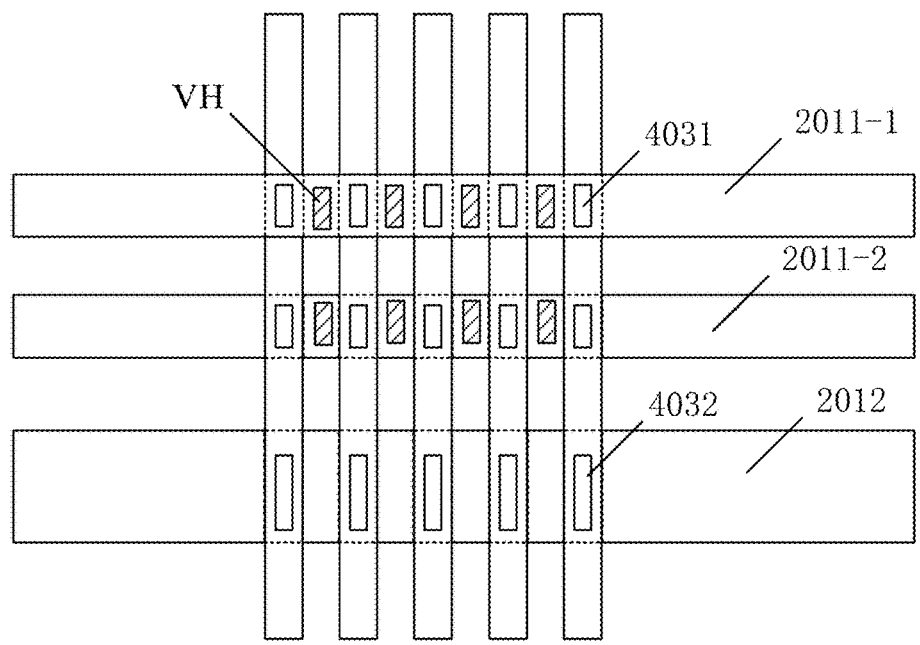
FIG. 27 is another schematic planar diagram of a touch wire overlapping with a first dam and a second dam in a display panel provided by at least one embodiment of the present disclosure.

For example, in an example, as illustrated in FIG. 27, the first dam 2011 includes a first portion 2011-1 and a second portion 2011-2, and the widths of the first portion 2011-1 and the second portion 2011-2 are respectively w1 and w2. There are first vias 4031 under the first portion 2011-1 and the second portion 2011-2, respectively, and w1 and w2 can respectively satisfy the above-mentioned relational expressions, that is:

$$0.5<(w1-D1)\times 0.5\times \tan(a1)/H1<0.95, \text{and}$$

$$0.5<(w2-D1)\times 0.5\times \tan(a1)/H1<0.95.$$

For example, the line width of the touch wire 401 (the length in the horizontal direction in the figure) is 15 μm, the width w1 of the first portion 2011-1 (the length in the vertical direction in the figure) and the width w2 of the second portion 2011-2 are both 40 μm, so that the size of the first via 4031 may be 6 μm×30 μm, and the size of the second via 4032 may be 6 μm×60 μm.

The larger the via 403A, the better the parallel connection of the double-layer wire of the touch wire 401, but because the sidewall of the dam has a slope, the degree of the slope gradually decreases from the edge to the middle of the slope, if the via 403A is provided on a side of the dam with a larger slope, the wire provided on the via 403A is likely to be broken. Therefore, the end of the via 403A should be as close as possible to the region with a smaller slope.

For example, the display panel further includes a shielding structure, as illustrated in FIG. 30 (FIG. 30 is obtained along a line EE in FIG. 1), in the direction perpendicular to the base substrate 101, the shielding structure V is located between the wires in the fan-shaped wire region F1 and the touch wire 401, the shielding structure V is insulated from the wires F1-1 in the fan-shaped wire region F1 by the insulating layer IN, and the distance between the touch wire 401 and the shielding structure (the vertical distance in the figure) is greater than the distance between the wires F1-1 in the fan-shaped wire region F1 and the shielding structure V (the vertical distance in the figure). The shielding structure V can shield the touch wire 401 and the wires F1-1 in the fan-shaped wire region F1, so as to prevent the electrical signals transmitted by the wires F1-1 in the fan-shaped wire region F1 from affecting the electrical signal transmitted on the touch wire 401.

For example, as illustrated in FIG. 30, the touch wire 401 includes a first wire portion located in the first touch metal layer 402 and a second wire portion located in the second touch metal layer 403, and the touch insulating layer 403 has a via located above the dam (illustrated as the first dam 2011 in the figure), and the first wire portion and the second wire portion of the touch wire 401 are electrically connected through the via.

For example, the shielding structure may be the first power wire V1 or the second power wire V2. For example, the first power wire V1 is a signal line VSS for transmitting a low potential, and the second power wire V2 is a signal line VDD for transmitting a high potential. For example, the wires in the fan-shaped wire region F1 are arranged in the same layer as the gate electrode 1021 of the thin film transistor T and the second capacitor electrode C2 of the storage capacitor C. At least part of the first power wire V1 or the second power wire V2 is arranged in the same layer as the source-drain electrodes 1022 and 1023 of the thin film transistor.

Figure 28:
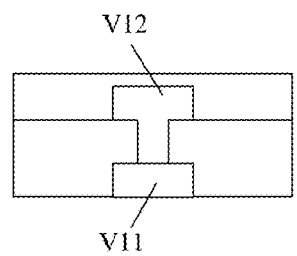
FIG. 28 is a schematic cross-sectional diagram of a first power wire in a display panel provided by at least one embodiment of the present disclosure.
Figure 29:
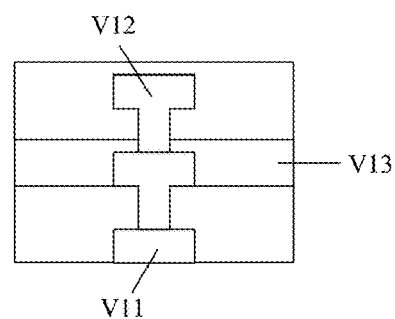
FIG. 29 is another schematic cross-sectional diagram of a first power wire in a display panel provided by at least one embodiment of the present disclosure.

For example, in one example, the shielding structure is the first power wire V1. As mentioned above, the first power wire V1 is, for example, a signal line VSS for transmitting a low potential, and the first power wire V1 may be provided in the same layer as the source-drain electrodes 1022 and 1023 of the thin film transistor T; or, as illustrated in FIG. 28 (FIG. 28 is obtained by cutting the first power wire V1 along a line D-D in FIG. 1), the first power wire V1 includes a first portion V11 and a second portion V12 connected in parallel. The first portion V11 is arranged in the same layer as the source-drain electrodes 1022 and 1023, and the second portion V12 is arranged in the same layer as the first electrode 104; or, as illustrated in FIG. 29 (for example, FIG. 29 is obtained by cutting the first power wire V1 along the line D-D in FIG. 1), the first power wire V1 includes a first portion V11, a second portion V12, and a third portion V13 connected in parallel. The first portion V11 is arranged in the same layer as the source-drain electrodes 1022 and 1023, the second portion V12 is arranged in the same layer as the first electrode 104, and the third portion V13 is arranged in the same layer as the connection electrode 103.

For example, in some embodiments, in the direction perpendicular to the base substrate 101, the shielding structure overlaps and directly contacts the first dam 2011 and the second dam 2012, that is, the first dam 2011 and the second dam 2012 directly cover the shielding structure, so as to protect the shielding structure.

For example, in some embodiments, as illustrated in FIGS. 26 and 24, the overlapping portion of the second portion V12 of the first power wire with the first dam 2011 has a plurality of openings VH, and the orthographic projections of the plurality of openings VH on the base substrate 101 and the orthographic projections of the plurality of vias 403A on the base substrate 101 do not overlap and are arranged alternately.

For example, as illustrated in FIG. 7, the first dam 2011 and the second dam 2012 respectively include a first sidewall and a second sidewall that are opposite, and the first sidewall is closer to the display region AA than the second sidewall. The slope angle formed by the first sidewall of the first dam 2011 and the plane where the base substrate 101 is located is a1, the slope angle formed by the second sidewall of the first dam 2011 and the plane where the base substrate 101 is located is a2, and a1 is greater than, less than, or equal to a2. The slope angle formed by the first sidewall of the second dam 2012 and the plane where the base substrate 101 is located is b1, the slope angle formed by the second sidewall of the second dam 2012 and the plane where the base substrate 101 is located is b2, and b1 is greater than b2, and $$0\leq |a1-a2|/(b1-b2)<1.$$

If the slope angle formed by the sidewall of the dam close to the display region AA and the plane where the base substrate 101 is located is small, the material of the first organic layer 312 inkjet printed is likely to climb and overflow beyond the dam. If the slope angle formed by the sidewall of the dam away from the display region AA and the plane where the base substrate 101 is located is large, when the display panel is cut, the cutting stress is likely to cause the peeling of the inorganic encapsulation layer. Therefore, the above design improves the slope angle of the dam to reduce the above-mentioned ink printing overflow and inorganic encapsulation layer peeling problems without increasing the complexity of the process.

For example, in some embodiments, the angle a1, a2, and b1 may range from 10° to 40°, and the angle b2 may range from 30° to 50°. For example, a1, a2, and b1 are all 20°, b2 is 45°, and $$0 \leq |20-20|/(45-20) < 1.$$

For example, the above-mentioned design regarding the slope angle is applicable to the dams at various positions around the display region AA (for example, the upper, left and right side of the display region AA).

For example, in some embodiments, referring to FIG. 23, in the direction perpendicular to the base substrate 101, the second dam 2012 overlaps with the second portion V12 of the first power wire, and a portion of the second portion V12 of the first power wire that overlaps with the second dam 2012 includes a flat portion V121 and a slope portion V122. The slope angle formed by the surface of the flat portion V121 away from the base substrate 101 and the first sidewall of the second dam 2012 is b1. For example, in an example, for the display panel illustrated in FIG. 18, the first dam 2011 is arranged in the same layer as the second planarization layer 110, the pixel defining layer 107, and the spacer 108. The second dam 2012 is arranged in the same layer as the first planarization layer 109, the second planarization layer 110, the pixel defining layer 107, and the spacer 108.

For example, in some embodiments, referring to FIG. 1 to FIG. 11, the display panel has a display region AA and a peripheral region NA surrounding the display region AA. The peripheral region NA includes a first peripheral region NA1, a bending region B, and a second peripheral region. NA2, the first peripheral region NA is located on a side of the second peripheral region NA2 close to the display region AA, and the bending region B is provided between the first peripheral region NA1 and the second peripheral region NA2. The display panel includes a base substrate 101, a driving circuit layer 102, and an encapsulation layer 300. The driving circuit layer 102 is arranged on the base substrate 101. The encapsulation layer 300 is on a side of the driving circuit layer 102 away from the base substrate 101, and the encapsulation layer 300 covers the display region AA and at least part of the first peripheral region NA1. The portion of the encapsulation layer 300 located in the first peripheral region NA1 includes a first encapsulation portion 301 and a second encapsulation portion 302. The first encapsulation portion 301 is located on a side of the second encapsulation portion 302 close to the display region AA. In the direction perpendicular to the base substrate 101, the average thickness of the first encapsulation portion 301 is greater than the average thickness of the second encapsulation portion 302.

In the display panel provided by the various embodiments of the present disclosure, through the above-mentioned design of the encapsulation layer, the encapsulation layer can have a better encapsulation effect, and the encapsulation layer is not easily peeled off when the display panel is bent. When the touch wire is formed on the encapsulation layer, the touch wire can be formed by precise etching, so as to avoid problems such as the short circuit between adjacent touch wires. In addition, through the design of the organic structure, the organic structure can better block inkjet printing materials, and the organic structure can cooperate with the encapsulation layer to better block water, oxygen and other impurities, thereby allowing the display panel provided by the embodiments of the present disclosure to have better reliability.

The following several statements should be noted:
(1) The accompanying drawings involve only the structure(s) in connection with the embodiment(s) of the present disclosure, and other structure(s) can be referred to common design(s).
(2) It should understood that, in the case that a component such as a layer, film, region, substrate or the like is referred to be "on" or "under" another component, it may be directly on or under the another component or a component is interposed therebetween.
(3) In case of no conflict, embodiments of the present disclosure and the features in the embodiments may be mutually combined to obtain new embodiments.

The above descriptions are only specific embodiments of the present disclosure, but the protection scope of the present disclosure is not limited thereto, the protection scope of the present disclosure should be determined by the protection scope of the claims.

What is claimed is:

1. A display panel, having a display region and a peripheral region surrounding the display region, wherein the peripheral region comprises a first peripheral region, a bending region, and a second peripheral region, the first peripheral region is on a side of the second peripheral region close to the display region, and the bending region is between the first peripheral region and the second peripheral region; and the display panel comprises:
   a base substrate;
   a driving circuit layer on the base substrate;
   an organic structure on a side of the driving circuit layer away from the base substrate, wherein the organic structure comprises a first organic structure and a second organic structure spaced apart in the peripheral region, the first organic structure is on a side of the second organic structure close to the display region, the first organic structure is in the first peripheral region, and the second organic structure comprises a first portion in the first peripheral region and a second portion in the bending region which are continuous; and
   an encapsulation layer on a side of the organic structure away from the base substrate, wherein the encapsulation layer covers the display region and at least part of the first peripheral region, the encapsulation layer partially overlaps with the second organic structure in a direction perpendicular to the base substrate, a portion of the encapsulation layer which overlaps with the second organic structure comprises a first encapsulation portion and a second encapsulation portion, and the first encapsulation portion is on a side of the second encapsulation portion close to the display region,
   wherein in the direction perpendicular to the base substrate, an average thickness of the first encapsulation portion is greater than an average thickness of the second encapsulation portion, wherein the first organic structure comprises a first dam and a second dam which are arranged at an interval, and the first dam is on a side of the second dam close to the display region,
   wherein a direction from the display region to the bending region is a first direction; and
   in the first direction, the first dam has a first width W1, the second dam has a second width W2, a minimum distance between the second organic structure and the second dam is L2, and $$L2 > 0.5*(W1+W2).$$

2. The display panel according to claim 1, wherein a direction from the display region to the bending region is a first direction, the second encapsulation portion comprises a plurality of encapsulation regions sequentially arranged in the first direction, and average thicknesses of the plurality of encapsulation regions gradually decrease in the first direction.

3. The display panel according to claim 1, further comprising a touch layer,
wherein the touch layer comprises a touch electrode and a touch wire electrically connected to the touch electrode, the touch wire extends from the display region to the second peripheral region, and at least part of the touch wire is on a side of the encapsulation layer away from the base substrate and overlaps with the second organic structure in the direction perpendicular to the base substrate; and
the touch wire comprises a first touch wire portion and a second touch wire portion, the first touch wire portion is on a side of the first encapsulation portion away from the base substrate, the second touch wire portion is on a side of the second encapsulation portion away from the base substrate, and an average distance from a surface of the first touch wire portion away from the base substrate to the base substrate is greater than an average distance from a surface of the second touch wire portion away from the base substrate to the base substrate.

4. The display panel according to claim 1, wherein the encapsulation layer comprises a first inorganic layer, a first organic layer, a second inorganic layer, and a third inorganic layer which are sequentially stacked; and
the first organic layer is covered by the first inorganic layer and the second inorganic layer, an edge of the first organic layer is on a side of the first organic structure close to the display region, and each of the first encapsulation portion and the second encapsulation portion comprises the first inorganic layer, the second inorganic layer, and the third inorganic layer which are stacked.

5. The display panel according to claim 1, wherein at least part of a surface of the second encapsulation portion away from the base substrate is a curved surface.

6. The display panel according to claim 1, wherein a surface of at least part of the second encapsulation portion away from the base substrate has a varying slope in a direction away from the display region,
in the surface of the at least part of the second encapsulation portion away from the base substrate, a slope of a portion close to the display region is greater than a slope of a portion away from the display region.

7. The display panel according to claim 6, wherein a slope difference between a maximum value and a minimum value of the slope of the surface of the at least part of the second encapsulation portion away from the base substrate is greater than 0 and smaller than 0.2.

8. The display panel according to claim 1, wherein the first dam and the second dam respectively comprise a first sidewall and a second sidewall which are opposite, the second organic structure comprises a third sidewall on a side close to the first organic structure, and the first encapsulation portion covers at least the third sidewall; and
the first sidewall, the second sidewall, and the third sidewall form a plurality of slope angles with a plane where the base substrate is located, each of the plurality of slope angles is an acute angle, and an absolute value of a difference between any two slope angles of the plurality of slope angles is smaller than 20°.

9. The display panel according to claim 8, wherein the third sidewall is step-shaped as a whole and comprises a first step and a second step,
the second step is on a side of the first step away from the base substrate, and
a slope angle formed by the first step with the plane where the base substrate is located is smaller than a slope angle formed by the second step with the plane where the base substrate is located.

10. The display panel according to claim 1, wherein the second encapsulation portion ends at a side of the bending region close to the display region, and
in the direction perpendicular to the base substrate, the average thickness of the first encapsulation portion is greater than twice the average thickness of the second encapsulation portion.

11. The display panel according to claim 10, wherein a minimum distance between an orthographic projection of the second encapsulation portion on the base substrate and an orthographic projection of the second dam on the base substrate is a first distance,
a minimum distance between an orthographic projection of the first encapsulation portion on the base substrate and the orthographic projection of the second dam on the base substrate is a second distance, and
the first distance is greater than 1.5 times the second distance.

12. A display panel, having a display region and a peripheral region surrounding the display region, wherein the peripheral region comprises a first peripheral region, a bending region, and a second peripheral region, the first peripheral region is on a side of the second peripheral region close to the display region, and the bending region is between the first peripheral region and the second peripheral region; and the display panel comprises:
a base substrate;
a driving circuit layer on the base substrate;
an organic structure on a side of the driving circuit layer away from the base substrate, wherein the organic structure comprises a first organic structure and a second organic structure spaced apart in the peripheral region, the first organic structure is on a side of the second organic structure close to the display region, the first organic structure is in the first peripheral region, and the second organic structure comprises a first portion in the first peripheral region and a second portion in the bending region which are continuous; and
an encapsulation layer on a side of the organic structure away from the base substrate, wherein the encapsulation layer covers the display region and at least part of the first peripheral region, the encapsulation layer partially overlaps with the second organic structure in a direction perpendicular to the base substrate, a portion of the encapsulation layer which overlaps with the second organic structure comprises a first encapsulation portion and a second encapsulation portion, and the first encapsulation portion is on a side of the second encapsulation portion close to the display region,
wherein in the direction perpendicular to the base substrate, an average thickness of the first encapsulation portion is greater than an average thickness of the second encapsulation portion, wherein the first organic structure comprises a first dam and a second dam which are arranged at an interval, and the first dam is on a side of the second dam close to the display region; and a surface of at least one of the first dam and the second dam comprises at least one second groove, and the at least one second groove extends in a direction parallel to a bending axis of the bending region.

13. The display panel according to claim 12, wherein the at least one second groove comprises n−1 second grooves, the at least one of the first dam and the second dam is divided into n portions by the n−1 second grooves, and n is a positive integer greater than or equal to 2; and a direction from the display region to the bending region is a first direction, in the first direction, widths of the n portions are w1, w2, . . . , wn, respectively, widths of the n−1 second grooves are d1, d2, . . . , dn−1, respectively, d represents at least one of d1, d2, . . . , dn−1, and $d < 2 \times (w1+w2+ \ldots wn)/n;\ w1, w2, \ldots, wn > 0.$ 14. The display panel according to claim 13, wherein the n portions comprise an i-th portion and a j-th portion, a width of the i-th portion is wi, a width of the j-th portion is wj, an i-th groove is provided between the i-th portion and the j-th portion, a width of the i-th groove is di, and $di > |wi-wj|,\ 1 \le i \le n-1,\ 1 \le j \le n,\ j=i+1.$ 15. The display panel according to claim 14, wherein a thickness of at least one of the first dam and the second dam is H, a depth of the second groove is h, and $h = k \times H,\ 0.5 \le k \le 1,$ a surface of the second dam comprises the at least one second groove, the second dam comprises a first sidewall and a second sidewall which are opposite, the first sidewall is closer to the display region than the second sidewall, and a slope angle formed by the first sidewall with a plane where the base substrate is located is b1; and the second groove comprises a third sidewall and a fourth sidewall which are opposite, the third sidewall is closer to the display region than the fourth sidewall, a slope angle formed by the third sidewall with the plane where the base substrate is located is c1, a slope angle formed by the fourth sidewall with the plane where the base substrate is located is c2, c represents at least one of c1 and c2, and $h/\tan c + H/\tan b1 < w1,$ $\arctan [k \times H/(w1 - H/\tan b1)] < c < 90°.$ 16. A display panel, having a display region and a peripheral region surrounding the display region, wherein the peripheral region comprises a first peripheral region, a bending region, and a second peripheral region, the first peripheral region is on a side of the second peripheral region close to the display region, and the bending region is between the first peripheral region and the second peripheral region; and the display panel comprises:

a base substrate;

a driving circuit layer on the base substrate;

an organic structure on a side of the driving circuit layer away from the base substrate, wherein the organic structure comprises a first organic structure and a second organic structure spaced apart in the peripheral region, the first organic structure is on a side of the second organic structure close to the display region, the first organic structure is in the first peripheral region, and the second organic structure comprises a first portion in the first peripheral region and a second portion in the bending region which are continuous; and an encapsulation layer on a side of the organic structure away from the base substrate, wherein the encapsulation layer covers the display region and at least part of the first peripheral region, the encapsulation layer partially overlaps with the second organic structure in a direction perpendicular to the base substrate, a portion of the encapsulation layer which overlaps with the second organic structure comprises a first encapsulation portion and a second encapsulation portion, and the first encapsulation portion is on a side of the second encapsulation portion close to the display region, wherein in the direction perpendicular to the base substrate, an average thickness of the first encapsulation portion is greater than an average thickness of the second encapsulation portion, the display panel further comprises a touch layer on a side of the encapsulation layer away from the base substrate, wherein the touch layer comprises a first touch metal layer, a touch insulating layer, and a second touch metal layer which are sequentially disposed on a side of the encapsulation layer away from the base substrate; and the second touch metal layer comprises a touch driving electrode extending in a first direction and a driving sensing electrode extending in a second direction, the first direction intersects the second direction, the driving sensing electrode comprises a plurality of separated portions, and the first touch metal layer comprises at least one bridge electrode for electrically connecting the plurality of separated portions;

the touch layer further comprises a touch wire electrically connected to the touch driving electrode or the driving sensing electrode, the touch wire comprises a first wire portion in the first touch metal layer and a second wire portion in the second touch metal layer, the touch insulating layer comprises at least one via, and the first wire portion and the second wire portion are electrically connected through the at least one via, the first organic structure comprises a first dam and a second dam which are arranged at an interval, the first dam is on a side of the second dam close to the display region, and an extending direction of the at least one via is perpendicular to an extending direction of the first dam and the second dam;

in the direction perpendicular to the base substrate, the at least one via comprises a first via overlapping with the first dam and a second via overlapping with the second dam;

an orthographic projection of the first via on the base substrate is within an orthographic projection of the first dam on the base substrate, and does not overlap with an edge of the orthographic projection of the first dam on the base substrate; and an orthographic projection of the second via on the base substrate is within an orthographic projection of the second dam on the base substrate, and does not overlap with an edge of the orthographic projection of the second dam on the base substrate.

17. The display panel according to claim 16, wherein in the direction perpendicular to the base substrate, an overlapping area of the touch wire and the first dam is S, an overlapping area of the first via and the first dam is S1, and $0.2 < S1/S < 0.4$; and an overlapping area of the touch wire and the second dam is SS, an overlapping area of the second via and the second dam is SS1, and 0.2<SS1/SS<0.4.

18. The display panel according to claim 16, wherein a slope angle formed by a sidewall of the first dam close to the display region and a plane where the base substrate is located is a1, a width of the first dam is W1, a height of the first dam is H1, an extension length of the first via is D1, and $$0.5<(W1-D1)\times 0.5\times \tan(a1)/H1<0.95;$$

a slope angle formed by a sidewall of the second dam close to the display region and the plane where the base substrate is located is b1, a width of the second dam is W2, a height of the second dam is H2, an extension length of the second via is D2, and $$0.5<(W2-D2)\times 0.5\times \tan(b1)/H2<0.95.$$

19. The display panel according to claim 16, further comprising a fan-shaped wire region in the first peripheral region, wherein the fan-shaped wire region comprises a plurality of wires; and the display panel further comprises a shielding structure, in the direction perpendicular to the base substrate, the shielding structure is between the plurality of wires in the fan-shaped wire region and the touch wire, and a distance between the touch wire and the shielding structure is greater than a distance between the plurality of wires in the fan-shaped wire region and the shielding structure.

* * * * *